(12) United States Patent
Seo et al.

(10) Patent No.: US 12,035,540 B2
(45) Date of Patent: Jul. 9, 2024

(54) MAGNETIC MEMORY DEVICE

(71) Applicant: Samsung Electronics Co., Ltd., Suwon-si (KR)

(72) Inventors: Boyoung Seo, Suwon-si (KR); Kangho Lee, Seongnam si (KR); Yoonjong Song, Seoul (KR); Junghyuk Lee, Hwaseong si (KR)

(73) Assignee: Samsung Electronics Co., Ltd. (KR)

( * ) Notice: Subject to any disclaimer, the term of this patent is extended or adjusted under 35 U.S.C. 154(b) by 415 days.

(21) Appl. No.: 17/380,081

(22) Filed: Jul. 20, 2021

(65) Prior Publication Data

US 2022/0028928 A1    Jan. 27, 2022

(30) Foreign Application Priority Data

Jul. 23, 2020   (KR) .................. 10-2020-0091752
Dec. 11, 2020   (KR) .................. 10-2020-0173678

(51) Int. Cl.
*H10B 61/00*      (2023.01)
*H10B 20/20*      (2023.01)

(52) U.S. Cl.
CPC ............. *H10B 61/22* (2023.02); *H10B 20/20* (2023.02)

(58) Field of Classification Search
CPC ............................... H10B 61/22; H10B 20/20
USPC ........................................................ 257/427
See application file for complete search history.

(56) References Cited

U.S. PATENT DOCUMENTS

| | | | |
|---|---|---|---|
| 8,804,410 B2 | 8/2014 | Oh et al. | |
| 9,165,631 B2 | 10/2015 | Kim et al. | |
| 9,614,144 B1 | 4/2017 | Annunziata et al. | |
| 9,805,816 B2 | 10/2017 | Jan et al. | |
| 9,966,149 B2 | 5/2018 | Kim et al. | |
| 10,431,276 B2 | 10/2019 | Seo et al. | |
| 10,840,445 B2* | 11/2020 | Yamamoto | H10N 70/8833 |
| 2017/0110171 A1* | 4/2017 | Seo | G11C 17/02 |
| 2017/0186472 A1* | 6/2017 | Jan | G11C 29/028 |
| 2019/0198077 A1* | 6/2019 | Seo | H10N 50/10 |
| 2019/0348986 A1* | 11/2019 | Kay | H03K 19/17764 |
| 2020/0098440 A1 | 3/2020 | Chuang et al. | |
| 2020/0194048 A1* | 6/2020 | Roy | H10B 61/20 |
| 2022/0028928 A1* | 1/2022 | Seo | H10B 20/20 |
| 2022/0301647 A1* | 9/2022 | Choy | G11C 17/16 |
| 2022/0343962 A1* | 10/2022 | Trantham | G11C 11/2297 |
| 2023/0061882 A1* | 3/2023 | Chuang | H10N 50/01 |
| 2023/0079435 A1* | 3/2023 | Oka | G11C 11/161 |
| | | | 365/66 |

(Continued)

*Primary Examiner* — Jami Valentine Miller
(74) *Attorney, Agent, or Firm* — Myers Bigel, P.A.

(57) ABSTRACT

A magnetic memory device includes a plurality of first bit lines and a plurality of second bit lines, a plurality of first source lines respectively corresponding to the plurality of first bit lines and a plurality of second source lines respectively corresponding to the plurality of second bit lines, a plurality of first memory cells connected between the plurality of first bit lines and the plurality of first source lines, respectively, in a first region, the plurality of first memory cells respectively including a first memory device and a first selection transistor, and a plurality of second memory cells connected between the plurality of second bit lines and the plurality of second source lines, respectively, in a second region, the plurality of second memory cells respectively including a second memory device and a second selection transistor.

20 Claims, 23 Drawing Sheets

(56) References Cited

U.S. PATENT DOCUMENTS

2023/0352070 A1* 11/2023 Uchida .............. G11C 11/1659

* cited by examiner

MAGNETIC MEMORY DEVICE

CROSS-REFERENCE TO RELATED APPLICATIONS

This application is based on and claims priority under 35 U.S.C. § 119 to Korean Patent Application Nos. 10-2020-0091752, filed on Jul. 23, 2020, and 10-2020-0173678, filed on Dec. 11, 2020, in the Korean Intellectual Property Office, the disclosure of each of which is incorporated by reference herein in its entirety.

The inventive concept relates to a magnetic memory device, and more particularly, to a magnetic memory device including a magnetic tunnel junction (MTJ) structure.

BACKGROUND

As electronic devices increase in speed and decrease in power, a fast write/read operation and a low operating voltage of a semiconductor device embedded in electronic products may be desired. As such, research is being done on magnetic memory devices using a magnetic resistance characteristic of an MTJ. Particularly, highly-integrated magnetic memory devices may perform a high-speed read operation and a high-speed write operation and may have non-volatility, and thus, are attracting much attention as next-generation memory devices.

SUMMARY

The inventive concept provides a highly-integrated magnetic memory device in which a normal memory cell array and a one time programmable (OTP) memory cell array are implemented in one memory chip.

The inventive concept is not limited to the aforesaid, and other embodiments or variations not specifically described herein will be clearly understood by those of ordinary skill in the art from descriptions below.

According to an aspect of the inventive concept, there is provided a magnetic memory device including a plurality of first bit lines and a plurality of second bit lines, a plurality of first source lines respectively corresponding to the plurality of first bit lines and a plurality of second source lines respectively corresponding to the plurality of second bit lines, a plurality of first memory cells connected between the plurality of first bit lines and the plurality of first source lines, respectively, in a first region, the plurality of first memory cells each including a first memory device and a first selection transistor, and a plurality of second memory cells connected between the plurality of second bit lines and the plurality of second source lines, respectively, in a second region, the plurality of second memory cells each including a second memory device and a second selection transistor, wherein each of the first memory device and the second memory device includes a magnetic tunnel junction including a pinned layer, a tunnel barrier layer, and a free layer, the magnetic tunnel junction in one or more of the second memory devices is configured to provide an irreversible resistance state in which the tunnel barrier layer is insulation-broken, and the plurality of first source lines extend perpendicular to the plurality of second source lines.

According to another aspect of the inventive concept, there is provided a magnetic memory device including a plurality of first active regions spaced apart from one another in a first direction and a second direction perpendicular to each other in a first region, a plurality of second active regions spaced apart from one another in the first direction to extend in the second direction in a second region, a plurality of first bit lines disposed in the first region and a plurality of second bit lines disposed in the second region, a plurality of first source lines respectively corresponding to the plurality of first bit lines and a plurality of second source lines respectively corresponding to the plurality of second bit lines, a plurality of first memory cells connected between the plurality of first bit lines and the plurality of first source lines, respectively, in the first region, the plurality of first memory cells each including a first memory device and a first selection transistor, and a plurality of second memory cells connected between the plurality of second bit lines and the plurality of second source lines, respectively, in the second region, the plurality of second memory cells each including a second memory device and a second selection transistor, wherein the plurality of first source lines extend in the second direction, the plurality of second source lines extend in the first direction, and one or more of the second memory devices is configured to provide an irreversible resistance state.

According to another aspect of the inventive concept, there is provided a magnetic memory device including a memory cell array including a normal cell array and a one time programmable (OTP) cell array and a peripheral circuit electrically connected to the normal cell array and the OTP cell array, wherein the normal cell array includes a plurality of first memory cells respectively including a first magnetic tunnel junction (MTJ) and a first selection transistor, the OTP cell array includes a plurality of second memory cells respectively including a second MTJ and a second selection transistor, one or more of the second MTJs is configured to provide an irreversible resistance state, and a first active region occupied by the plurality of first memory cells is smaller than a second active region occupied by the plurality of second memory cells.

BRIEF DESCRIPTION OF THE DRAWINGS

Embodiments of the inventive concept will be more clearly understood from the following detailed description taken in conjunction with the accompanying drawings in which.

DETAILED DESCRIPTION OF EMBODIMENTS

Hereinafter, embodiments will be described in detail with reference to the accompanying drawings.

Figure 1:
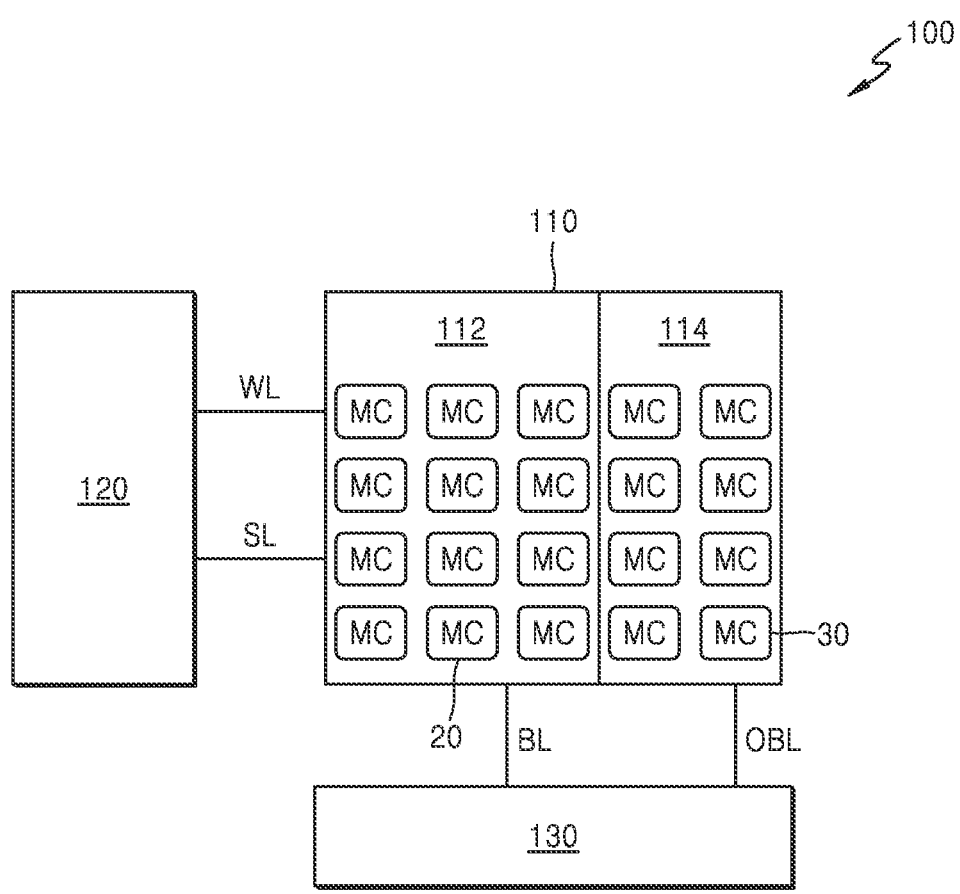
FIG. 1 is a block diagram illustrating a magnetic memory device including a variable resistance element, according to an embodiment.

FIG. 1 is a block diagram illustrating a magnetic memory device 100 including a variable resistance element, according to an embodiment.

Referring to FIG. 1, the magnetic memory device 100 may include a memory cell array 110, an address decoder circuit 120, and a data input/output (I/O) circuit 130.

The memory cell array 110 may include a plurality of memory cells MC which are arranged in rows and columns. The plurality of memory cells MC may include a plurality of magnetic memory cells each including a variable resistance element. For example, the magnetic memory device 100 may include magnetoresistive random access memory (MRAM) which includes a magnetic upper electrode, a magnetic lower electrode, and a dielectric therebetween.

In the magnetic memory device 100, each of the memory cells MC may include a selection transistor and a variable resistor implemented based on magnetic tunnel junction (MTJ). The memory cell array 110 may include a plurality of word lines WL, a plurality of bit lines BL and OBL, and a plurality of source lines SL, which are connected to the memory cells MC. Each of the word lines WL may be connected to a gate of each of memory cells MC placed in one of rows and may be connected to a source of a selection transistor and a variable resistor of each of memory cells MC placed in one of columns.

The memory cell array 110 may include a normal memory cell array 112 and a one time programmable (OTP) memory cell array 114.

The normal memory cell array 112 may include a plurality of normal memory cells 20, and each of the plurality of normal memory cells 20 may include a first selection transistor and a first variable resistance element. Each of the normal memory cell arrays 112 may include a first selection transistor, connected to each of a plurality of word lines WL respectively corresponding to rows, and a first variable resistance element connected to each of a plurality of bit lines respectively corresponding to columns. The terms "first," "second," etc. may be used herein merely to distinguish one element from another.

The OTP memory cell array 114 may include a plurality of OTP memory cells 30, and each of the OTP memory cells 30 may include a second selection transistor and a second variable resistance element. The OTP memory cells 30 may each have the same structure as that of each of the normal memory cells 20. The OTP memory cell array 114 may include a second selection transistor, connected to each of a plurality of word lines WL, and a second variable resistance element connected to a OTP bit line OBL corresponding to one of the columns, and the second variable resistance element may be short-circuited. In detail, the second variable resistance element of the OTP memory cell 30 may apply a breakdown voltage BV through one programming operation to insulation-break a tunnel barrier layer, and thus, may have an irreversible resistance state. That is, the tunnel barrier layer of the variable resistance element of an OTP memory cell 30 may be configured to be insulation-broken or otherwise programmed to provide an irreversible resistance state responsive to the breakdown voltage BV.

The address decoder circuit 120 and the data I/O circuit 130 may be provided as peripheral circuits of the memory cell array 110.

The address decoder circuit 120 may be connected to the memory cell array 110 through the word lines WL and the source lines SL. The address decoder circuit 120 may decode a row address so as to select the word lines WL and the source lines SL and may decode a column address so as to select the bit lines BL.

The data I/O circuit 130 may be connected to the memory cell array 110 through the bit lines BL and OBL. The data I/O circuit 130 may include a column selection circuit, a write driver circuit, and a sense amplifier circuit. The column selection circuit may select one bit line BL from among the plurality of bit lines BL in response to a column selection signal provided from the address decoder circuit 120, and the one bit line BL selected by the column selection circuit may be supplied with a certain read/write voltage through the write driver circuit on the basis of a read/write operation. Also, the sense amplifier circuit may determine data of the normal memory cell 20 in the normal memory cell array 112.

Figure 2:
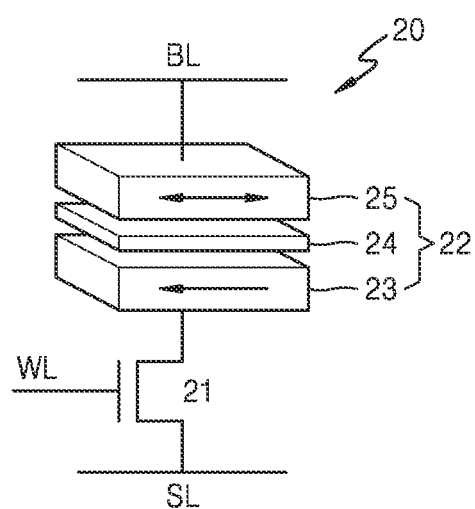
FIG. 2 is a block diagram illustrating a respective memory cell included in the memory cell array of FIG. 1.

FIG. 2 is a block diagram illustrating each memory cell included in the memory cell array 110 of FIG. 1.

Referring to FIG. 2, a normal memory cell 200 among a plurality of memory cells MC (see FIG. 1) included a memory cell array 110 (see FIG. 1) is illustrated.

The normal memory cell 200 may include a selection transistor 21 and an MTJ structure 22. A gate of the selection transistor 21 may be connected to a word line WL, and a drain electrode of the selection transistor 21 may be connected to a bit line BL through the MTJ structure 22. Also, a source electrode of the selection transistor 21 may be connected to a source line SL.

The MTJ structure 22 may include a pinned layer 23, a free layer 25, and a tunnel barrier layer 24 therebetween. A magnetization direction of the pinned layer 23 may be fixed, and a magnetization direction of the free layer 25 may be a parallel P direction or an anti-parallel AP direction with respect to the magnetization direction of the pinned layer 23 on the basis of data stored through a write operation. An anti-ferromagnetic layer may be further provided for fixing the magnetization direction of the pinned layer 23.

The pinned layer 23 may include a ferromagnetic material. For example, the pinned layer 23 may include at least one material selected from among CoFeB, Fe, Co, Ni, Gd, Dy, CoFe, NiFe, MnAs, MnBi, MnSb, CrO, MnOFeO, FeOFeO, NiOFeO, CuOFeO, MgOFeO, EuO, or YFeO.

The tunnel barrier layer 24 may include a nonmagnetic material. For example, the tunnel barrier layer 52 may include at least one material selected from among magnesium (Mg), titanium (Ti), aluminum (Al), magnesium zinc oxide (MgZnO), titanium nitride (TiN), or vanadium nitride (VN).

The free layer 25 may include a ferromagnetic material including at least one of cobalt (Co), iron (Fe), or nickel (Ni). For example, the free layer 25 may include at least one material selected from among FeB, Co, Ni, Gd, Dy, CoFe, NiFe, MnBi, MnSb, CrO, MnOFeO, FeOFeO, NiOFeO, CuOFeO, MgOFeO, EuO, or YFeO.

In some embodiments, when the free layer 25 and the pinned layer 23 of the MTJ structure 22 are in a parallel P state, namely, when the state of the MTJ structure 22 represents a low resistance value or low resistibility, the normal memory cell 20 may be defined as a data zero (0) logic state. On the other hand, when the free layer 25 and the pinned layer 23 of the MTJ structure 22 are in an anti-parallel AP state, namely, when the state of the MTJ structure 22 represents a high resistance value or high resistibility, the normal memory cell 20 may be defined as a data one (1) logic state. In other embodiments, the normal memory cell 20 may be defined as a data 0 logic state in the anti-parallel AP state of the MTJ structure 22 and may be defined as a data 1 logic state in the parallel P state of the MTJ structure 22.

Figure 3A:
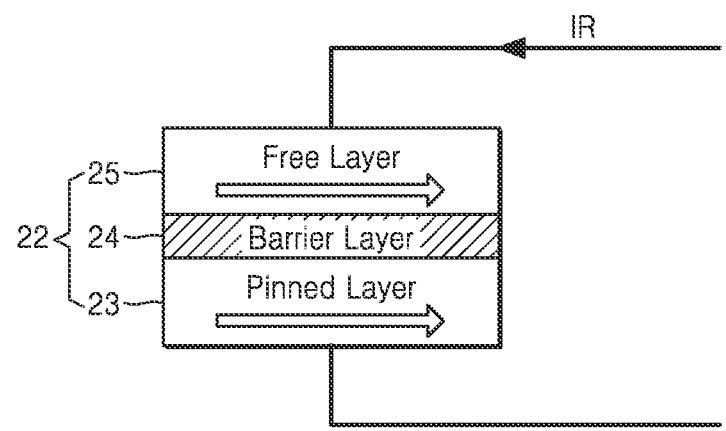
FIGS. 3A and 3B are diagrams illustrating data stored in a magnetization direction in a magnetic tunnel junction (MTJ) structure of the memory cell of FIG. 2.
Figure 3B:
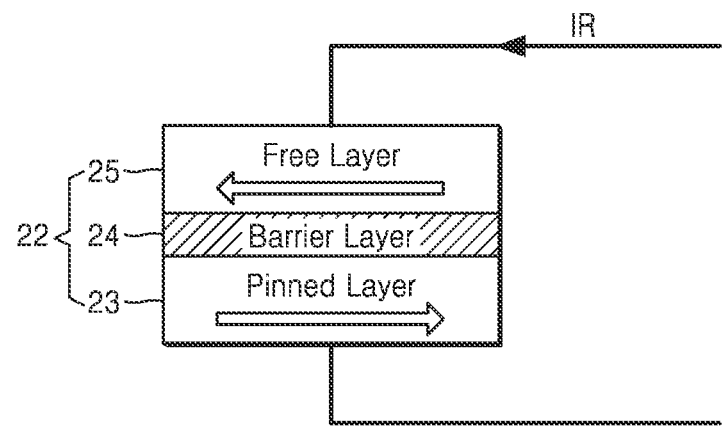

FIGS. 3A and 3B are diagrams illustrating data stored in a magnetization direction in the MTJ structure of the memory cell of FIG. 2 in a read operation.

Referring to FIGS. 3A and 3B, a resistance value of an MTJ structure 22 may vary based on a magnetization direction of a free layer 25.

When a read current IR flows in the MTJ structure 22, a data voltage based on the resistance value of the MTJ structure 22 may be output. Intensity of the read current IR may be less than that of a write current, and thus, the magnetization direction of the free layer 25 may not be changed by the read current IR.

As illustrated in FIG. 3A, in the MTJ structure 22, the magnetization direction of the free layer 25 and a magnetization direction of a pinned layer 23 may be arranged in parallel. The MTJ structure 22 having such a state may have a low resistance value, and data 0 may be output through a read operation.

As illustrated in FIG. 3B, in the MTJ structure 22, the magnetization direction of the free layer 25 and the magnetization direction of the pinned layer 23 may be arranged in anti-parallel. The MTJ structure 22 having such a state may have a high resistance value, and data 1 may be output through a write operation.

Figure 4:
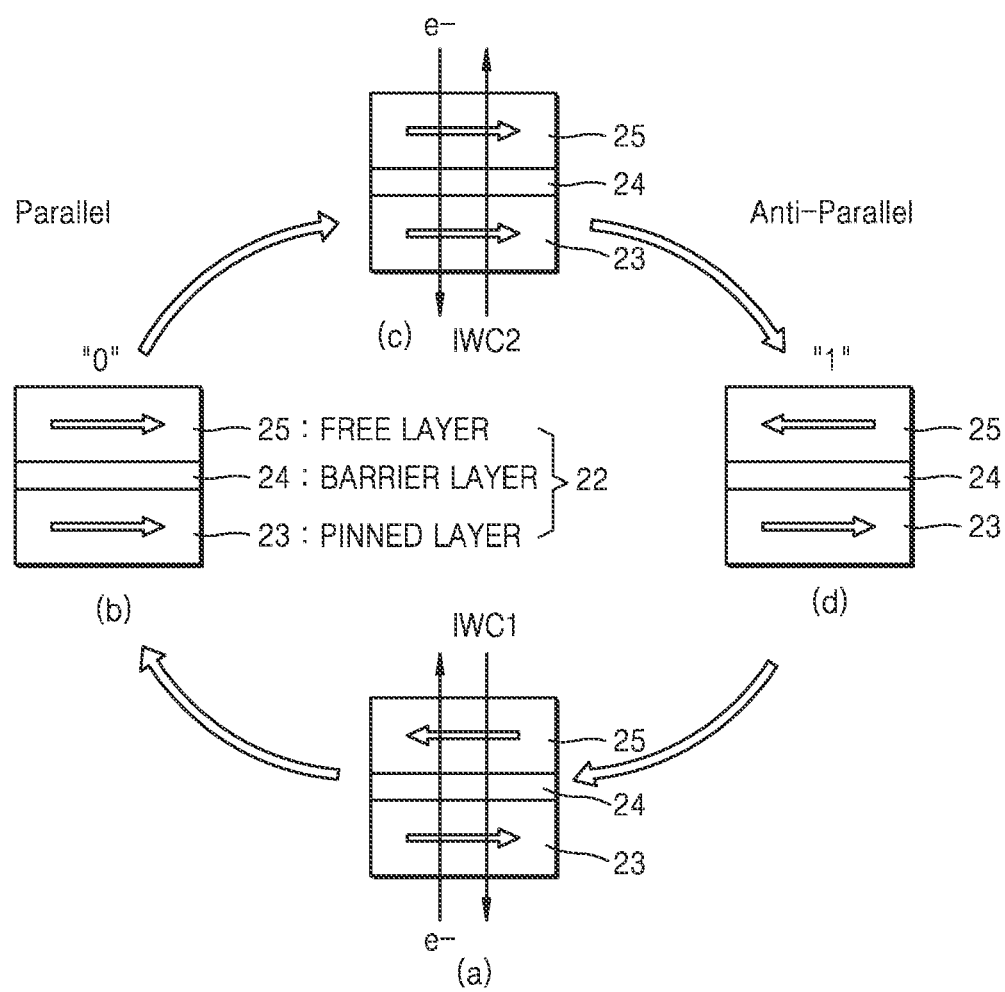
FIG. 4 is a diagram illustrating a magnetization direction on the basis of a write operation in the MTJ structure of the memory cell of FIG. 2.

FIG. 4 is a diagram illustrating a magnetization direction on the basis of a write operation in the MTJ structure of the memory cell of FIG. 2.

Referring to FIG. 4, a magnetization direction of a free layer 25 may be determined based on directions of write currents (for example, first and second write currents) IWC1 and IWC2 flowing in an MTJ structure 22.

As in (a), when the first write current IWC1 is applied in a direction from the free layer 25 to a pinned layer 23, free electrons having the same spin direction as that of the pinned layer 23 may apply torque to the free layer 25. Therefore, the free layer 25 may be magnetized in parallel with the pinned layer 23. Therefore, as in (b), data 0 having a low resistance value may be stored in the MTJ structure 22.

In the MTJ structure 22 having a data 0 state, as in (c), when the second write current IWC2 is applied from the pinned layer 23 to the free layer 25, free electrons having a spin direction opposite to that of the pinned layer 23 may return to the free layer 25 and may apply torque. Therefore, the free layer 25 may be magnetized in anti-parallel with the pinned layer 23. Therefore, as in (d), data 1 having a high resistance value may be stored in the MTJ structure 22.

That is, in the MTJ structure 22, the magnetization direction of the free layer 25 may be changed to be parallel or anti-parallel to the pinned layer 23 by spin transfer torque (STT), and thus, data 0 or data 1 may be stored therein.

FIGS. 5A to 7B are diagrams illustrating other embodiments of the MTJ structure of the memory cell of FIG. 2.

Figure 5A:
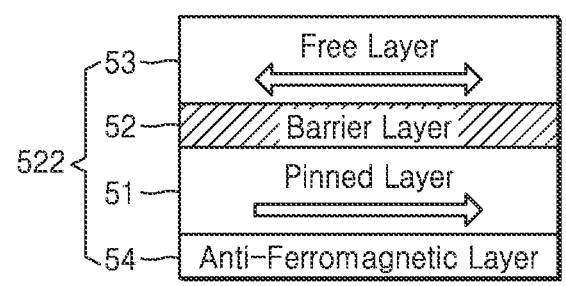
FIGS. 5A, 5B, 6, 7A, and 7B are diagrams illustrating other embodiments of the MTJ structure of the memory cell of FIG. 2.

Referring to FIG. 5A, an MTJ structure 522 may include a pinned layer 51, a tunnel barrier layer 52, a free layer 53, and an anti-ferromagnetic layer 54.

The anti-ferromagnetic layer 54 may include an anti-ferromagnetic material. For example, the anti-ferromagnetic layer 54 may include at least one material selected from among PtMn, IrMn, MnO, MnS, MnTe, MnF, FeCl, FeO, CoCl, CoO, NiCl, NiO, or Cr.

Each of the free layer 53 and the pinned layer 51 of the MTJ structure 522a may include a ferromagnetic material, and thus, a stray field may occur in an edge of the ferromagnetic material. The stray field may decrease a magnetic resistance, or may increase a resistance magnetic force of the free layer 53. Particularly, the stray field may adversely affect a switching characteristic to cause asymmetric switching. Therefore, a structure for decreasing or controlling the stray field occurring in the ferromagnetic material of the MTJ structure 22 may be needed.

Figure 5B:
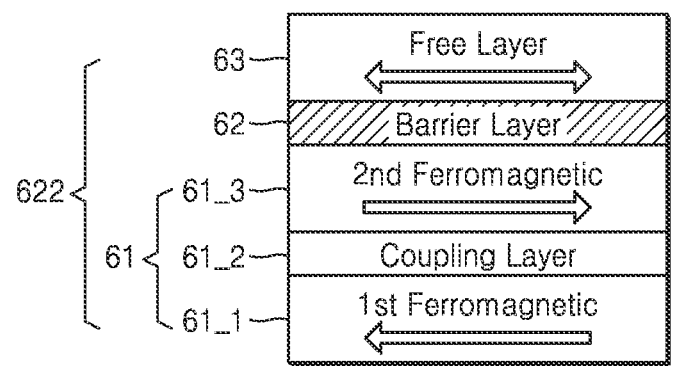

Referring to FIG. 5B, an MTJ structure 622 may include a pinned layer 61, a tunnel barrier layer 62, and a free layer 63, and the pinned layer 61 may be provided as a synthetic anti-ferromagnetic.

The pinned layer 61 may include a first ferromagnetic layer 61_1, a coupling layer 61_2, and a second ferromagnetic layer 61_3. For example, each of the first and second ferromagnetic layers 61_1 and 61_3 may include at least one material selected from among CoFeB, Fe, Co, Ni, Gd, Dy, CoFe, NiFe, MnAs, MnBi, MnSb, CrO, MnOFeO, FeOFeO, NiOFeO, CuOFeO, MgOFeO, EuO, or YFeO. For example, the coupling layer 61_2 may include ruthenium (Ru).

A magnetization direction of the first ferromagnetic layer 61_1 and a magnetization direction of the second ferromagnetic layer 61_3 may have different directions and may be fixed.

Figure 6:
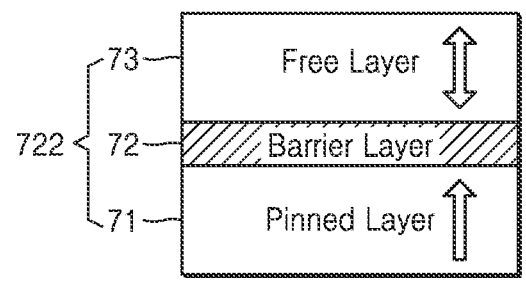

Referring to FIG. 6, the MTJ structure 722 may have a magnetization direction perpendicular to the tunnel barrier layer 72, and thus, a movement direction of a current may be substantially parallel to a magnetization easy axis.

A structure, where a magnetization direction is perpendicular, may be referred to as a perpendicular MTJ structure. The perpendicular MTJ structure 722 may also include a pinned layer 71, a tunnel barrier layer 72, and a free layer 73. When a magnetization direction of the free layer 73 is parallel to a magnetization direction of the pinned layer 71, a resistance value may decrease, and when the magnetization direction of the free layer 73 is anti-parallel to the magnetization direction of the pinned layer 71, a resistance value may increase. Therefore, data may be stored in the perpendicular MTJ structure 22 on the basis of a resistance value.

In order to implement the perpendicular MTJ structure 722, the free layer 73 and the pinned layer 71 may include a material which is high in magnetic anisotropic energy. For example, each of the free layer 73 and the pinned layer 71 may include an ordered alloy and may include at least one material selected from among Fe, Co, Ni, palladium (Pa), or platinum (Pt). Also, each of the free layer 73 and the pinned layer 71 may include at least one material selected from among a Fe—Pt alloy, a Fe—Pd alloy, a Co—Pd alloy, a Co—Pt alloy, a Fe—Ni—Pt alloy, a Co—Fe—Pt alloy, or a Co—Ni—Pt alloy.

Figure 7A:
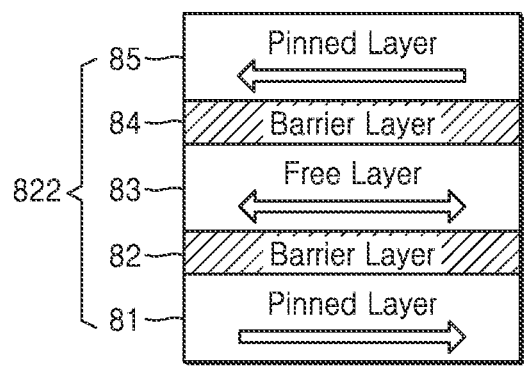

Referring to FIG. 7A, a dual MTN structure 822 is illustrated where a plurality of tunnel barrier layers (for example, first and second tunnel barrier layers) 82 and 84 and a plurality of pinned layers (for example, first and second pinned layers) 81 and 85 are respectively disposed at both ends thereof with reference to a free layer 83.

The dual MTJ structure 822 for generating a horizontal magnetic field may include the first pinned layer 81, the first tunnel barrier layer 82, the free layer 83, the second tunnel barrier layer 84, and the second pinned layer 85. The first and second pinned layers 81 and 85 may be similar to a pinned layer 51 (see FIG. 5A), the first and second tunnel layers 82 and 84 may be similar to a tunnel barrier layer 52 (see FIG. 5A), and the free layer 83 may be similar to a free layer 53 (see FIG. 5A).

When a magnetization direction of the first pinned layer 81 and a magnetization direction of the second pinned layer 85 are fixed to be opposite to each other, magnetic forces based on the first and second pinned layers 81 and 85 may be substantially offset. The dual MTJ structure 822 may perform a read operation by using a current which is lower than a conventional MTJ device. Due to the second barrier layer 84, the dual MTJ structure 822 may provide a higher resistance in performing a read operation, and thus, may obtain a more clear or discernable resistance value.

Figure 7B:
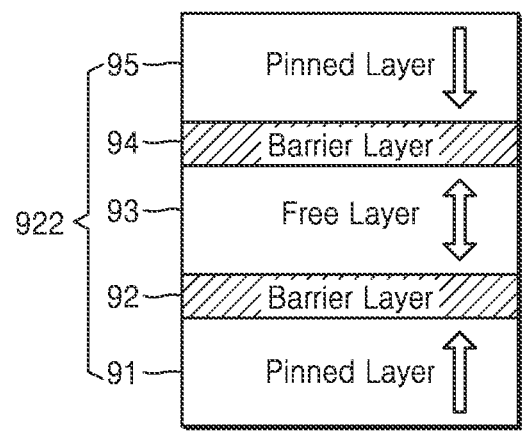

Referring to FIG. 7B, a perpendicular MTN structure 922 is illustrated where a plurality of tunnel barrier layers (for example, first and second tunnel barrier layers) 92 and 94 and a plurality of pinned layers (for example, first and second pinned layers) 91 and 95 are respectively disposed at both ends thereof with reference to a free layer 93.

The perpendicular MTJ structure 922 for generating a vertical magnetic field may include the first pinned layer 91, the first tunnel barrier layer 92, the free layer 93, the second tunnel barrier layer 94, and the second pinned layer 95. The first and second pinned layers 91 and 95 may be similar to a pinned layer 71 (see FIG. 6), the first and second tunnel layers 92 and 94 may be similar to a tunnel barrier layer 72 (see FIG. 6), and the free layer 93 may be similar to a free layer 73 (see FIG. 6).

When a magnetization direction of the first pinned layer 91 and a magnetization direction of the second pinned layer 95 are fixed to be opposite to each other, magnetic forces based on the first and second pinned layers 91 and 95 may be substantially offset. The perpendicular MTJ structure 22 may perform a read operation by using a current which is lower than a conventional MTJ device. Due to the second barrier layer 94, the perpendicular MTJ structure 22 may provide a higher resistance in performing a read operation, and thus, may obtain a more clear or discernable resistance value.

An MTJ structure of a normal memory cell 20 (see FIG. 1) described above with reference to FIGS. 3A to 7B may also be substantially identically applied to a OTP memory cell 30 (see FIG. 1) of a OTP memory cell array 114 (see FIG. 1).

In some embodiments, an MTJ structure of the OTP memory cell 30 may be or may include a resistance element which is a criterion for determining data of the normal memory cell 20. Therefore, in order to stably determine data of the normal memory cell 20, an MTJ structure of the OTP memory cell 30 may need or may be configured to have a certain resistance value, which in some embodiments may be different from the resistance value of the MTJ structure of the normal memory cell 20.

Figure 8:
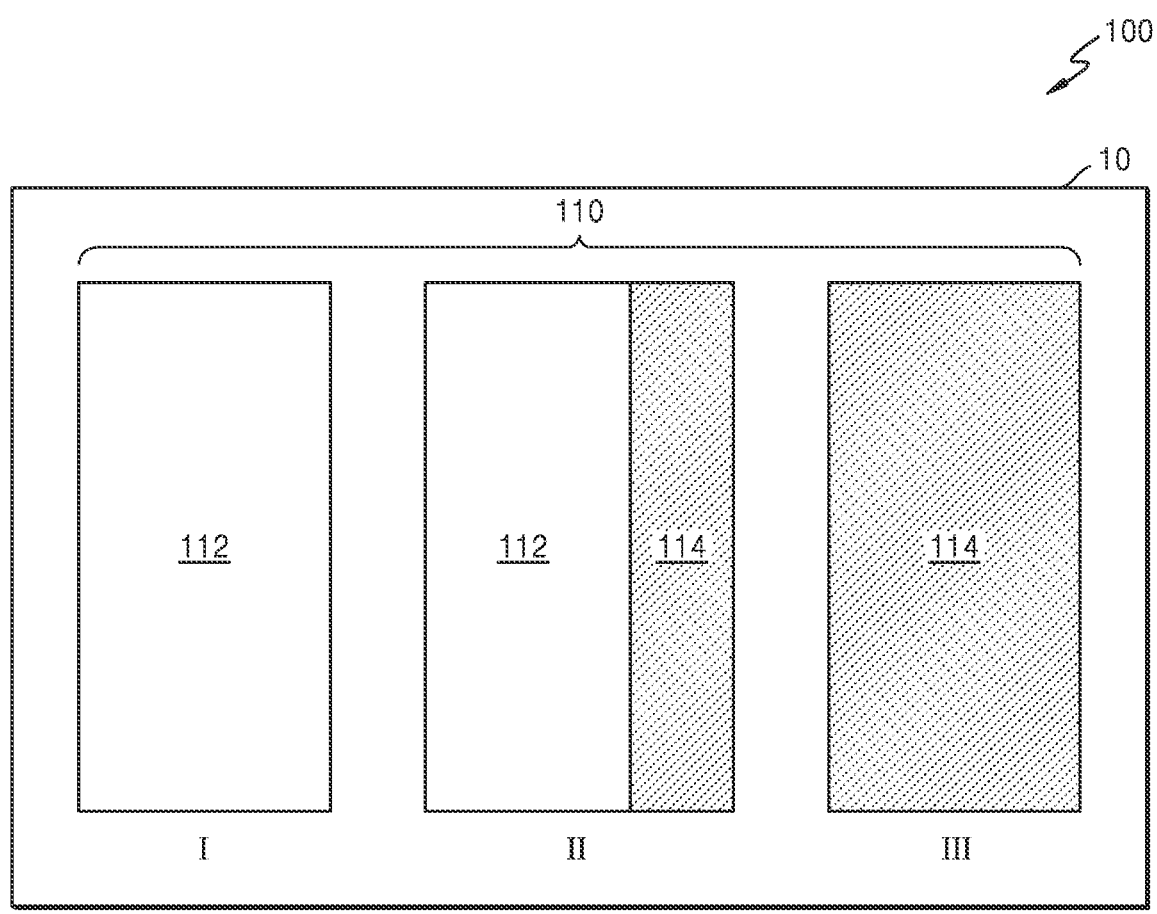
FIG. 8 is a schematic diagram illustrating an example where a memory cell array of a magnetic memory device according to an embodiment is arranged in one memory chip.

FIG. 8 is a schematic diagram illustrating an example where a memory cell array of a magnetic memory device 100 according to an embodiment is implemented in one memory chip.

Referring to FIG. 8, a portion of a memory cell array 110 implemented in one memory chip 10 may be implemented as a normal memory cell array 112, and another portion thereof may be implemented as a OTP memory cell array 114.

The magnetic memory device 100 according to an embodiment may be configured with one memory chip 10. That is, the magnetic memory device 100 may have a structure where the normal memory cell array 112 and the OTP memory cell array 114 are disposed in regions I and III apart from each other and/or are disposed at adjacent portions of a region II, in the one memory chip 10. When elements or regions are described as on or adjacent one another, intervening elements or regions may be present. In contrast, when elements or regions are described as directly on or immediately adjacent one another, no intervening elements or regions may be present.

Here, normal memory cells of the normal memory cell array 112 may be programmed a plurality of times, but OTP memory cells of the OTP memory cell array 114 may be programmed only once. That is, the magnetic memory device 100 may simultaneously use a magnetic random access memory (MRAM) device and a OTP device through the one memory chip 10.

Figure 9A:
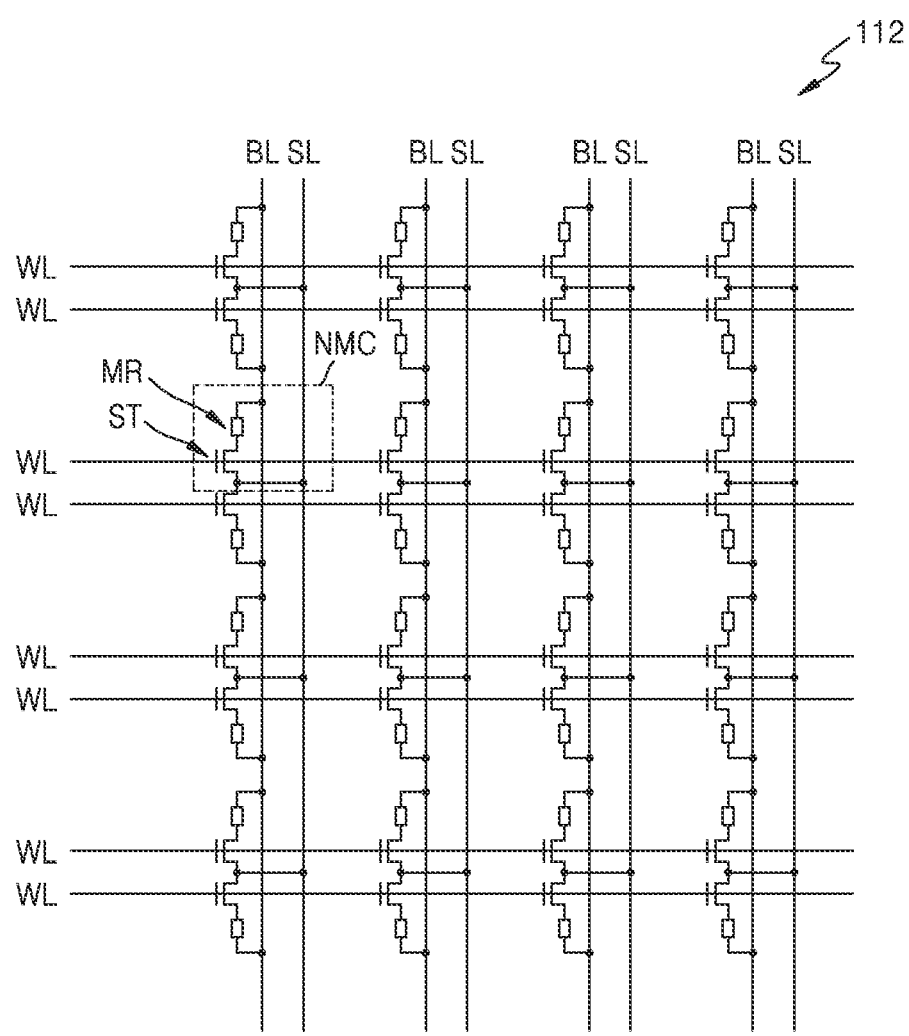
FIGS. 9A and 9B are circuit diagrams illustrating a memory cell array of a magnetic memory device, according to some embodiments.
Figure 9B:
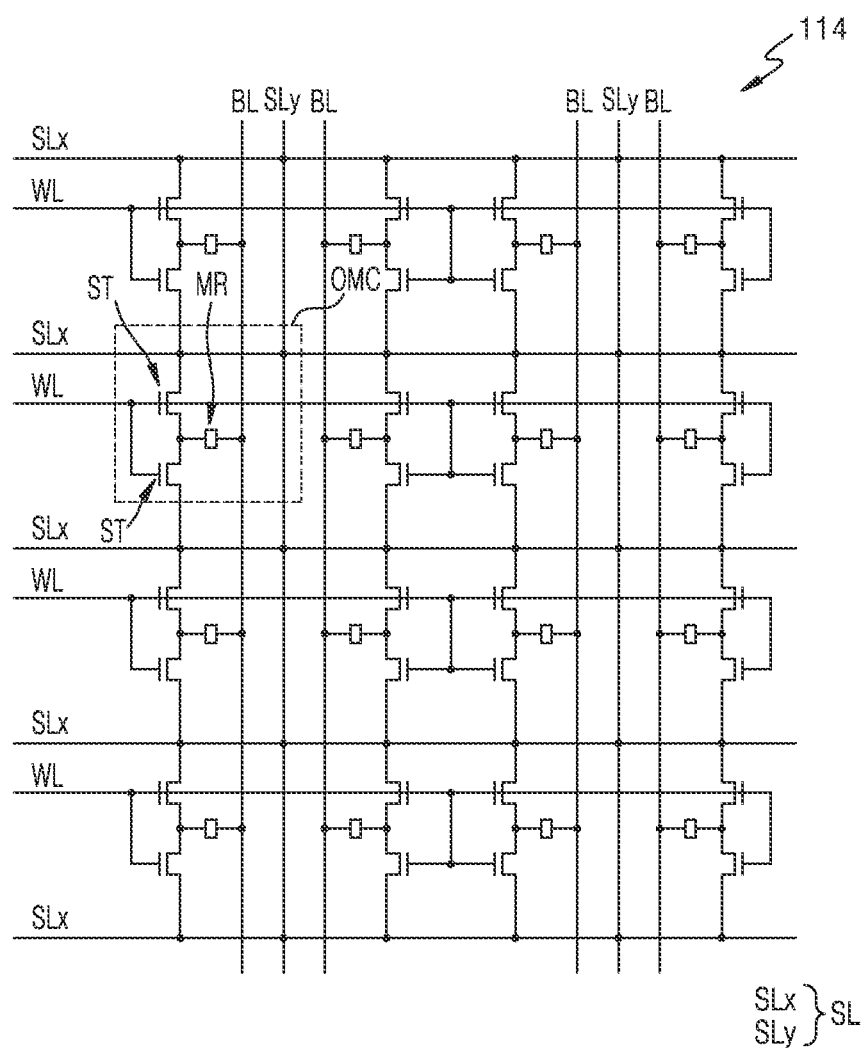

FIGS. 9A and 9B are circuit diagrams illustrating a memory cell array of a magnetic memory device according to some embodiments.

Referring to FIG. 9A, a normal memory cell array 112 may be a matrix arranged in rows and columns and may include a plurality of normal memory cells NMC, a plurality of word lines WL, a plurality of bit lines BL, and a plurality of source lines SL.

Each of the normal memory cells NMC may be implemented as an STT-MRAM cell. Also, each of the normal memory cells NMC may include a magnetic resistance element implemented based on MTJ. Each of the normal memory cells NMC may include a selection transistor ST and an MTJ structure MR. A gate of the selection transistor ST may be connected to a word line WL, a drain thereof may be connected to one end of the MTJ structure MR, and a source thereof may be connected to a source line SL. The other end of the MTJ structure MR may be connected to a bit line BL.

In some embodiments, a 1T-1R structure where one normal memory cell NMC is connected to one selection transistor ST may configure or define one unit memory cell in a circuit diagram. In some other embodiments, a 2T-2R structure where two adjacent normal memory cells NMC are connected to two selection transistors ST in common may configure or define one unit memory cell in a circuit diagram.

Referring to FIG. 9B, a OTP memory cell array 114 may be a matrix arranged in rows and columns and may include a plurality of OTP memory cells OMC, a plurality of word lines WL, a plurality of bit lines BL, and a plurality of source lines SL.

Each of the OTP memory cells OMC may be implemented as an STT-MRAM cell. Also, each of the OTP memory cells OMC may include a magnetic resistance element implemented based on MTJ. Each of the OTP memory cells OMC may include a selection transistor ST and an MTJ structure MR. A gate of the selection transistor ST may be connected to a word line WL, a drain thereof may be connected to one end of the MTJ structure MR, and a source thereof may be connected to a source line SL. The other end of the MTJ structure MR may be connected to a bit line BL.

In the OTP memory cell array 114, the plurality of source lines SL may include a first source line SLx extending in a first direction (an X direction) and a second source line SLy extending in a second direction (a Y direction) perpendicular to the first direction (the X direction). The first source line SLx and the second source line SLy may be connected to intersect with each other. In some embodiments, the plurality of source lines SL may include only the first source line SLx.

In some embodiments, a 2T-1R structure where one OTP memory cell OMC is connected to two selection transistors ST may configure or define one unit memory cell in a circuit diagram.

FIGS. 10A to 12C are layout or plan views illustrating memory cell arrays of a magnetic memory device according to some embodiments.

Figure 10A:
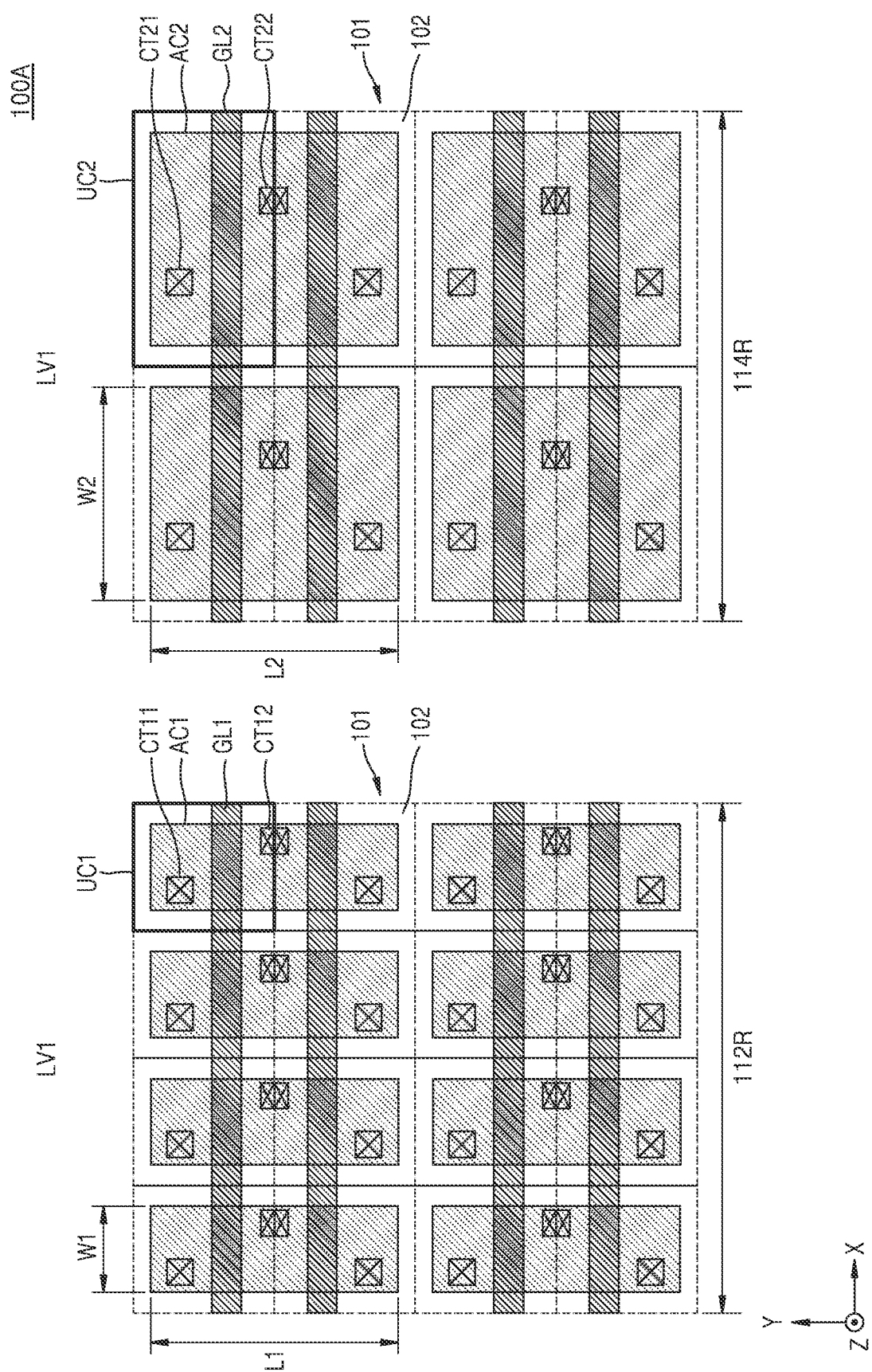
FIGS. 10A, 10B, 10C, 11A, 11B, 11C, 12A, 12B, and 12C are layouts or plan views illustrating memory cell arrays of a magnetic memory device, according to some embodiments.
Figure 10B:
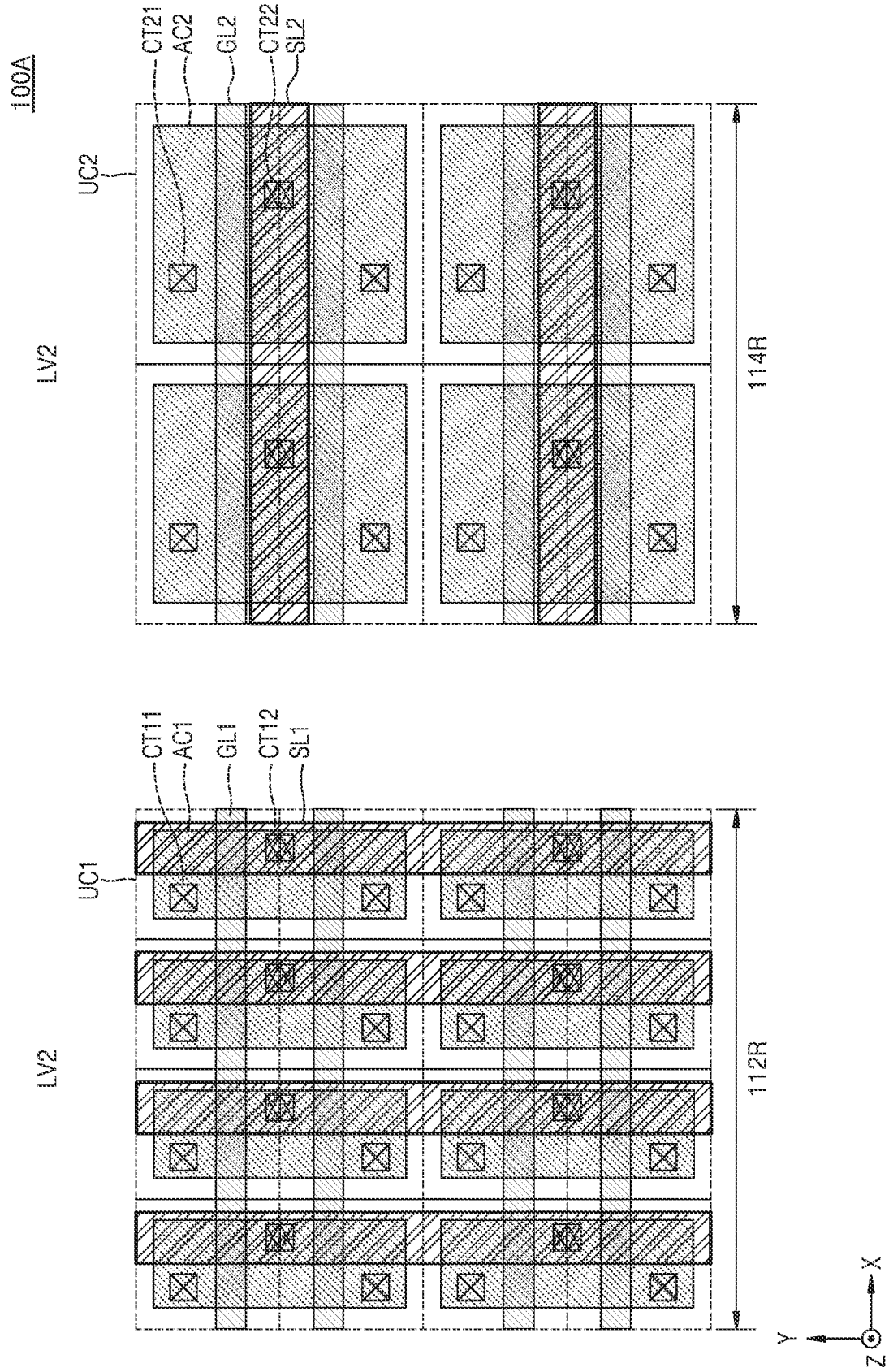
Figure 10C:
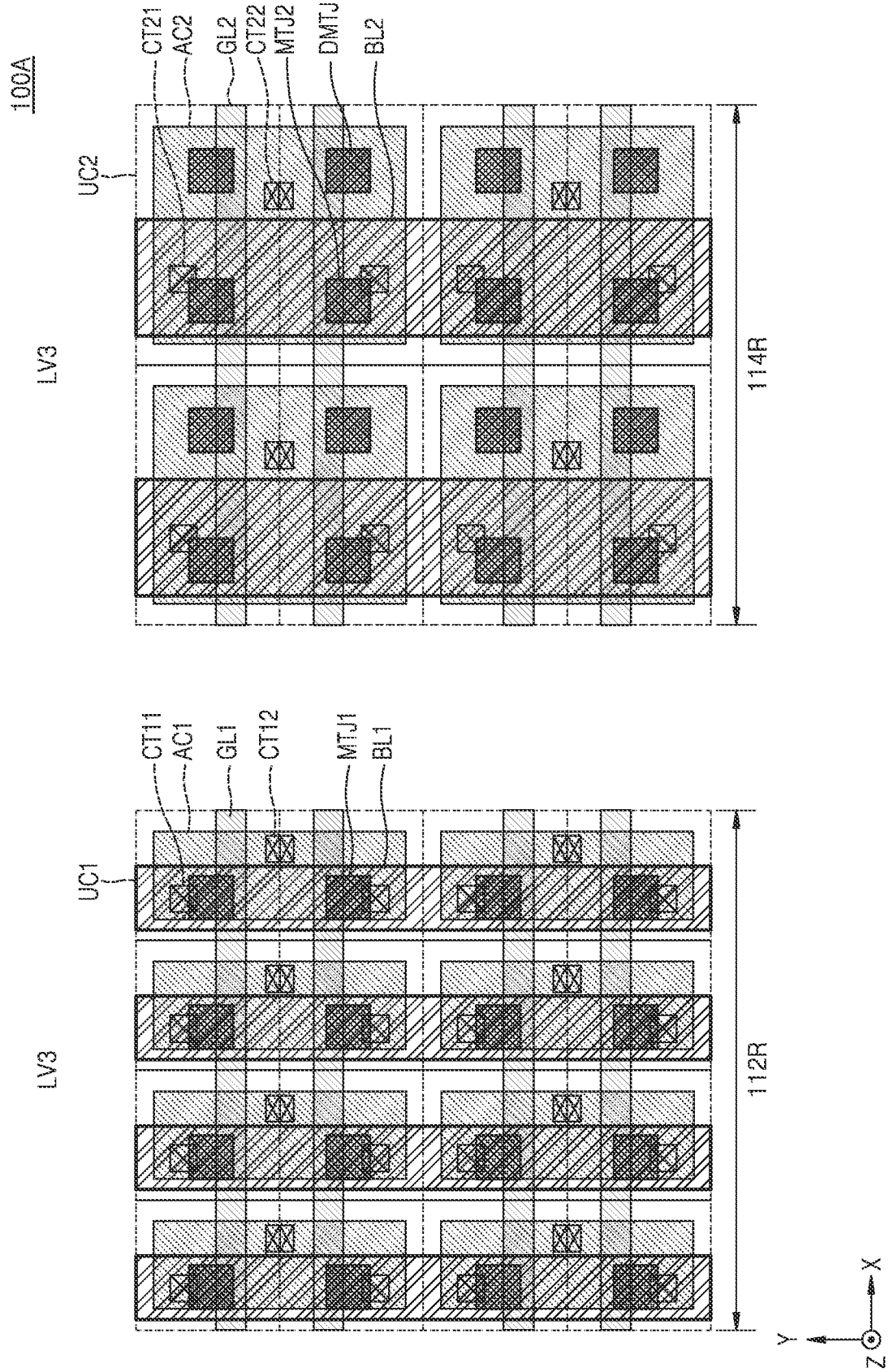
Figure 11A:
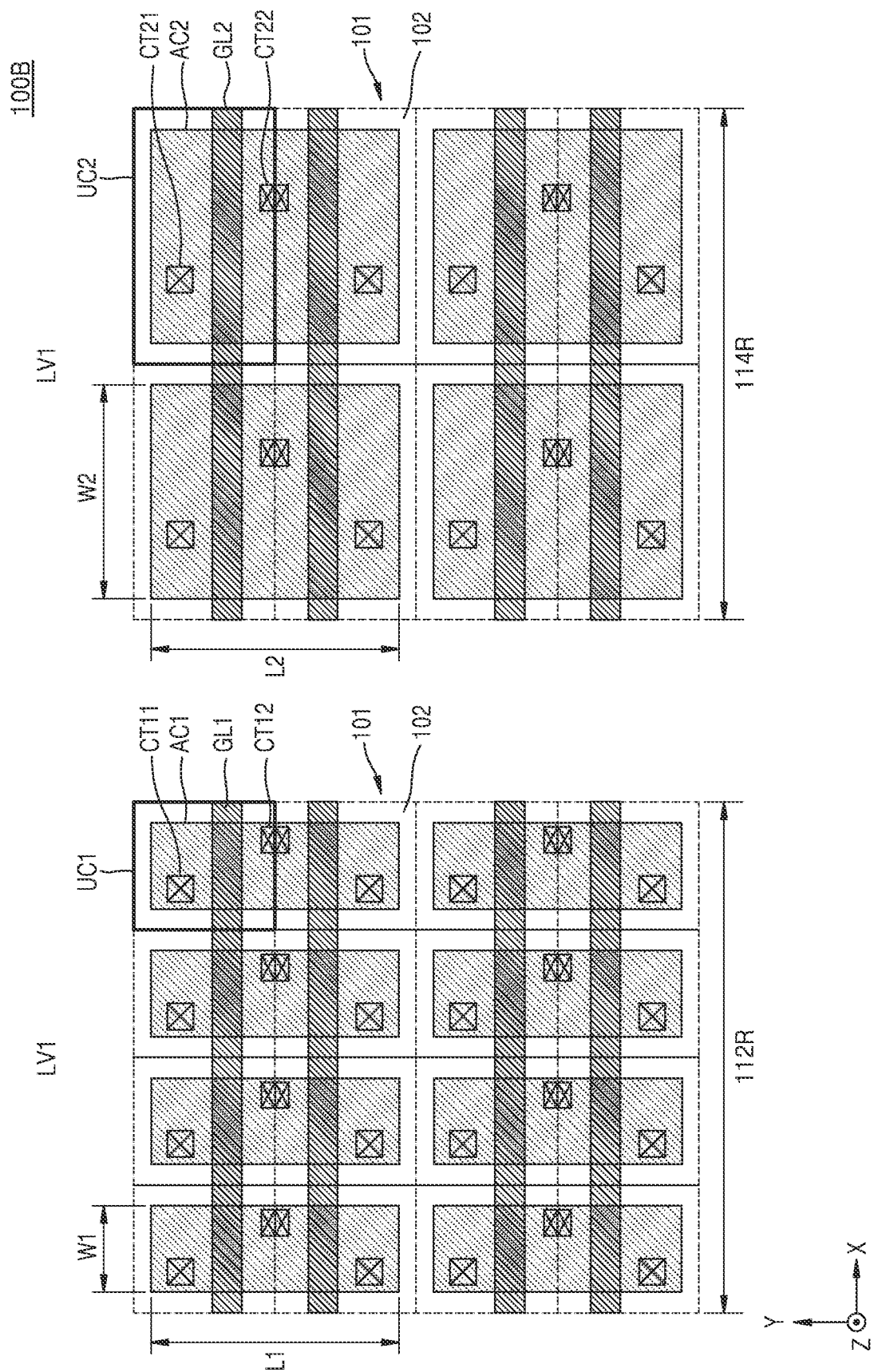
Figure 11B:
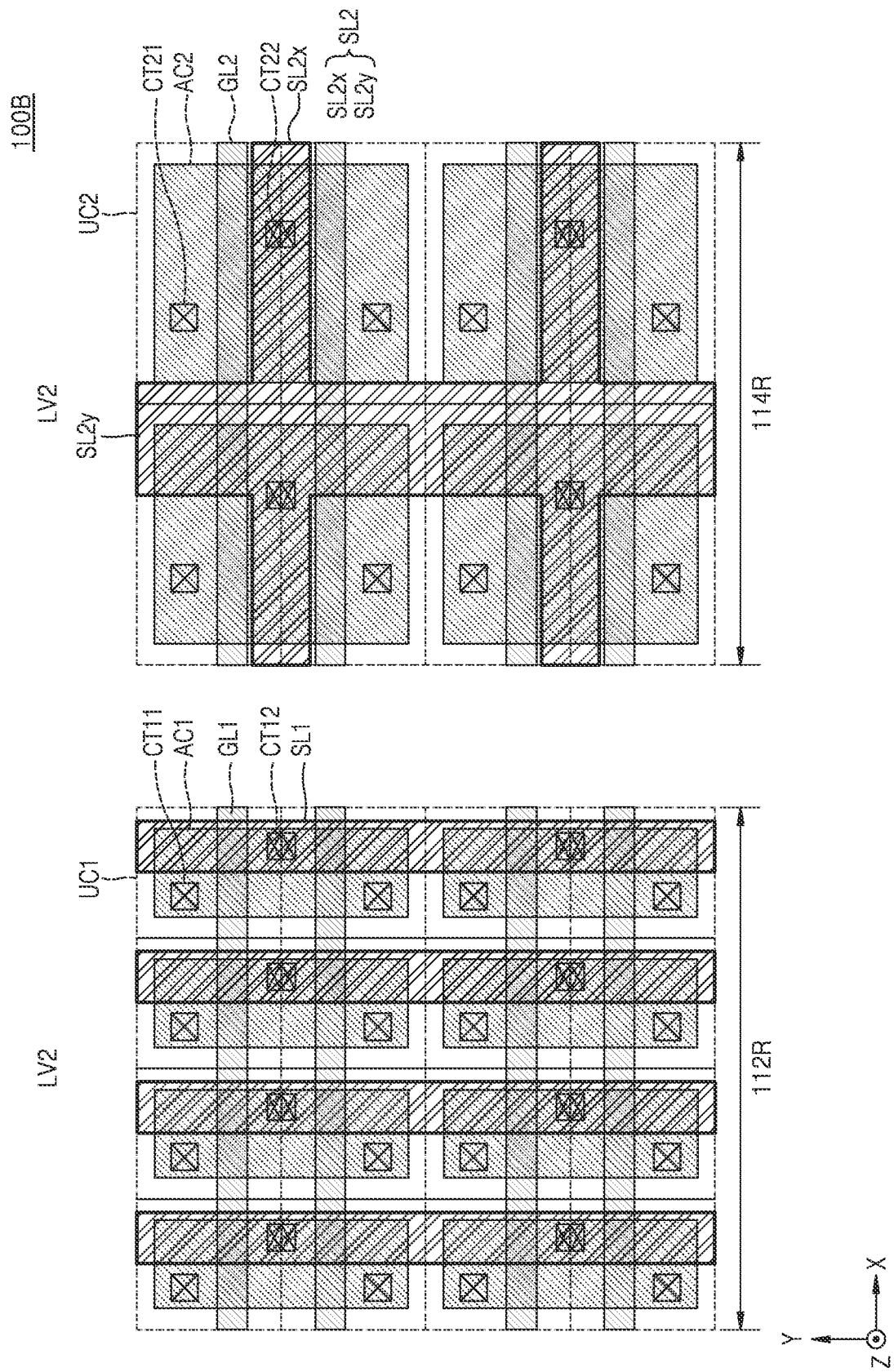
Figure 11C:
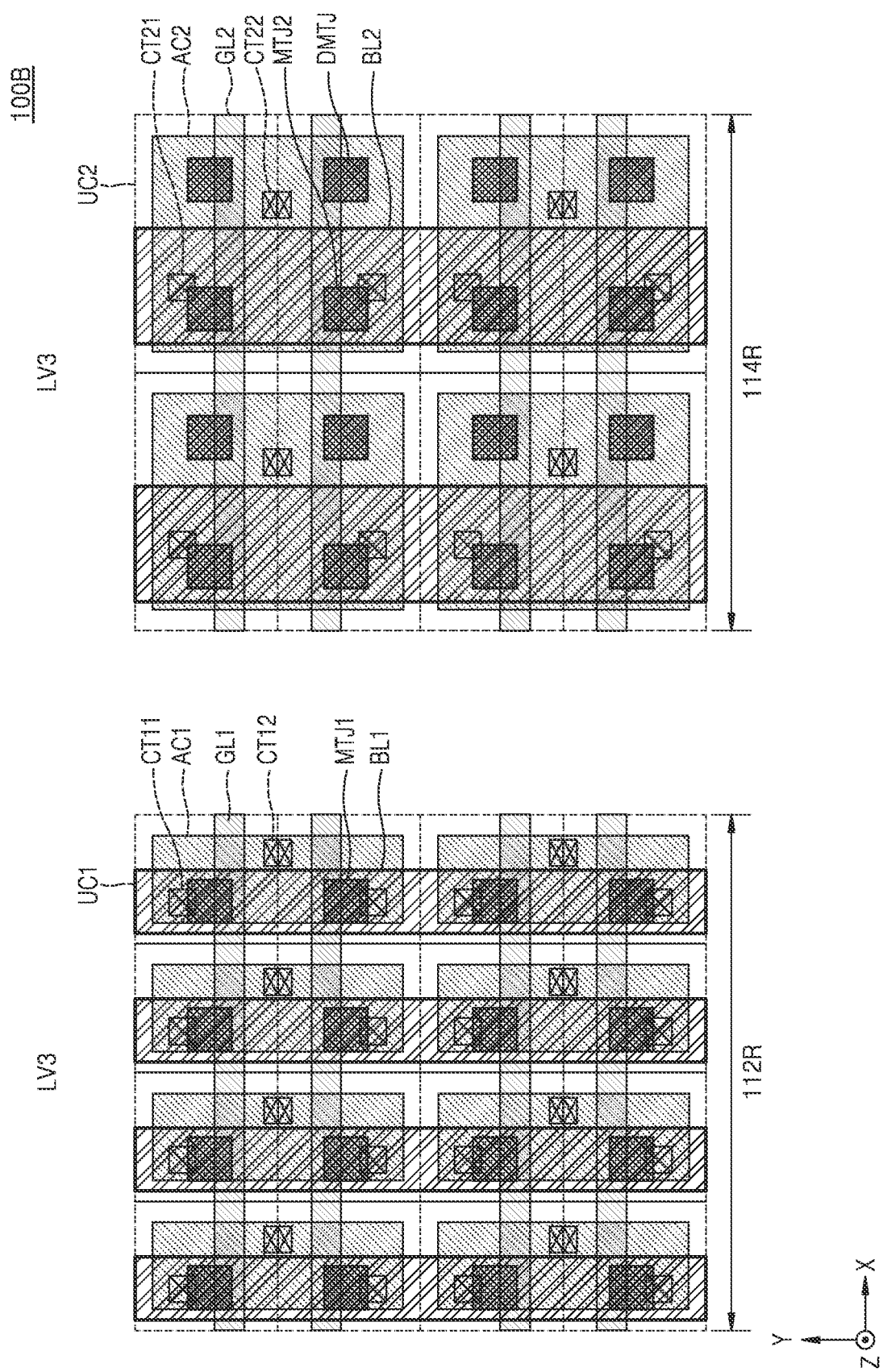
Figure 12A:
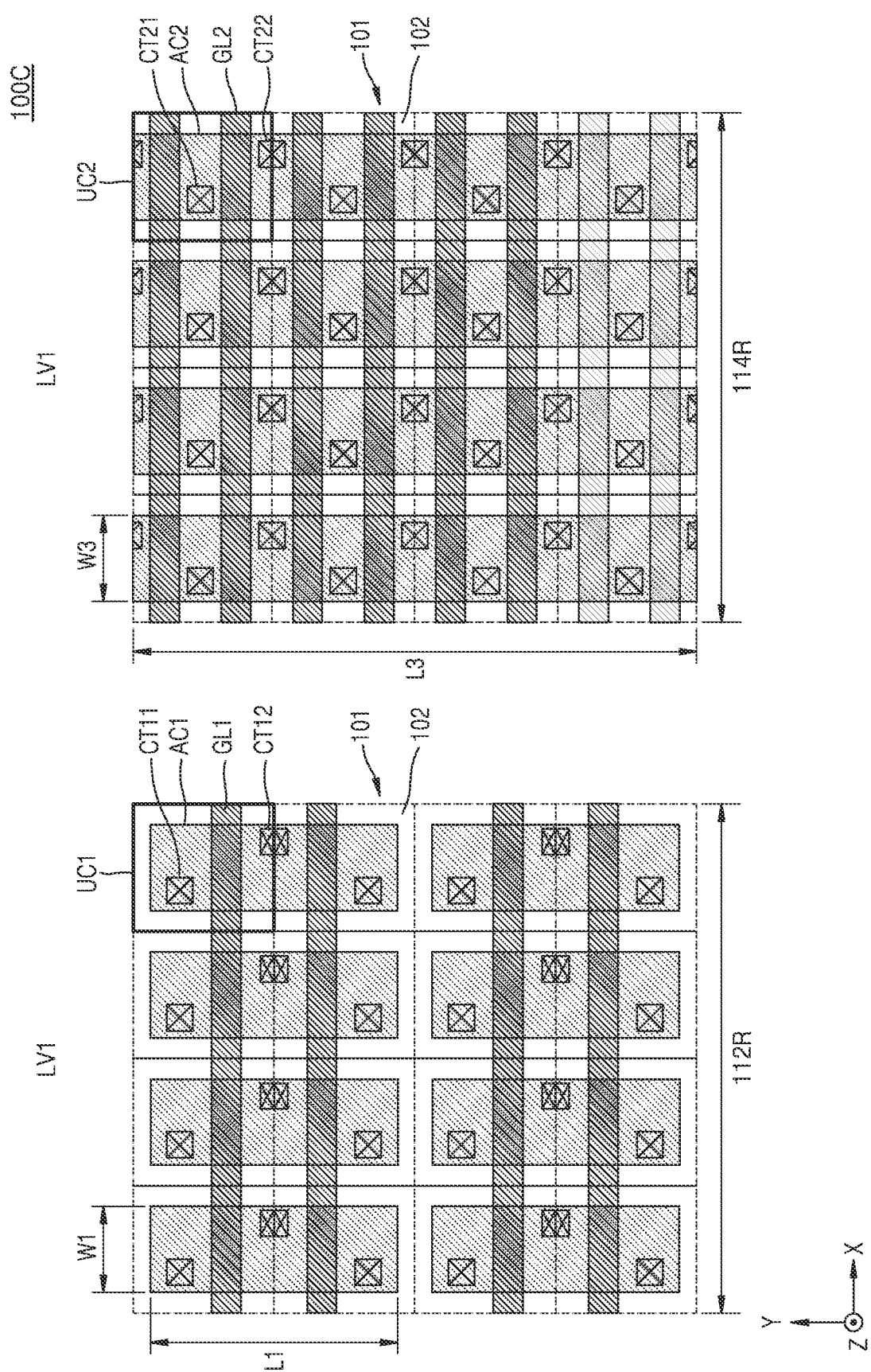
Figure 12B:
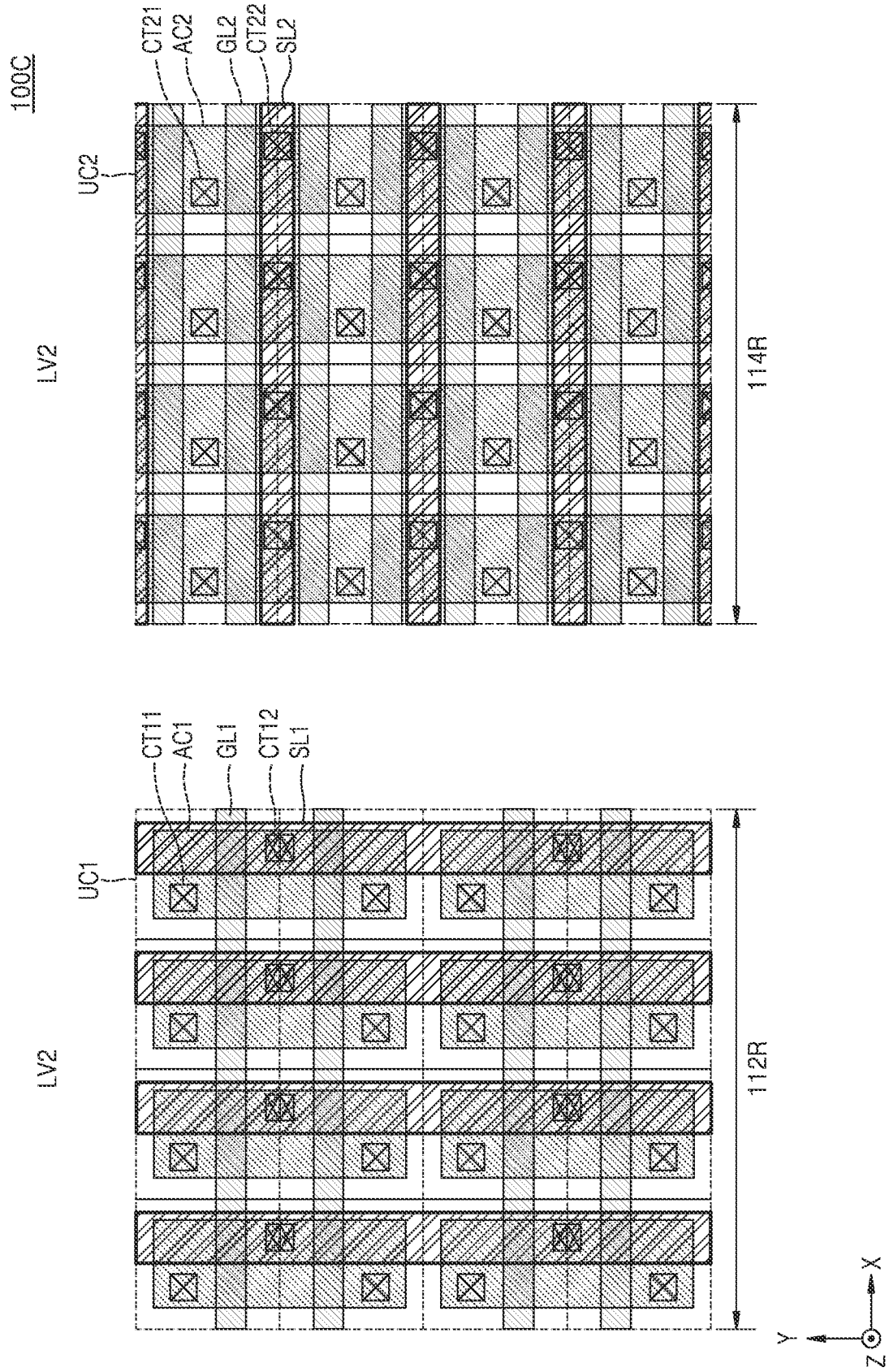
Figure 12C:
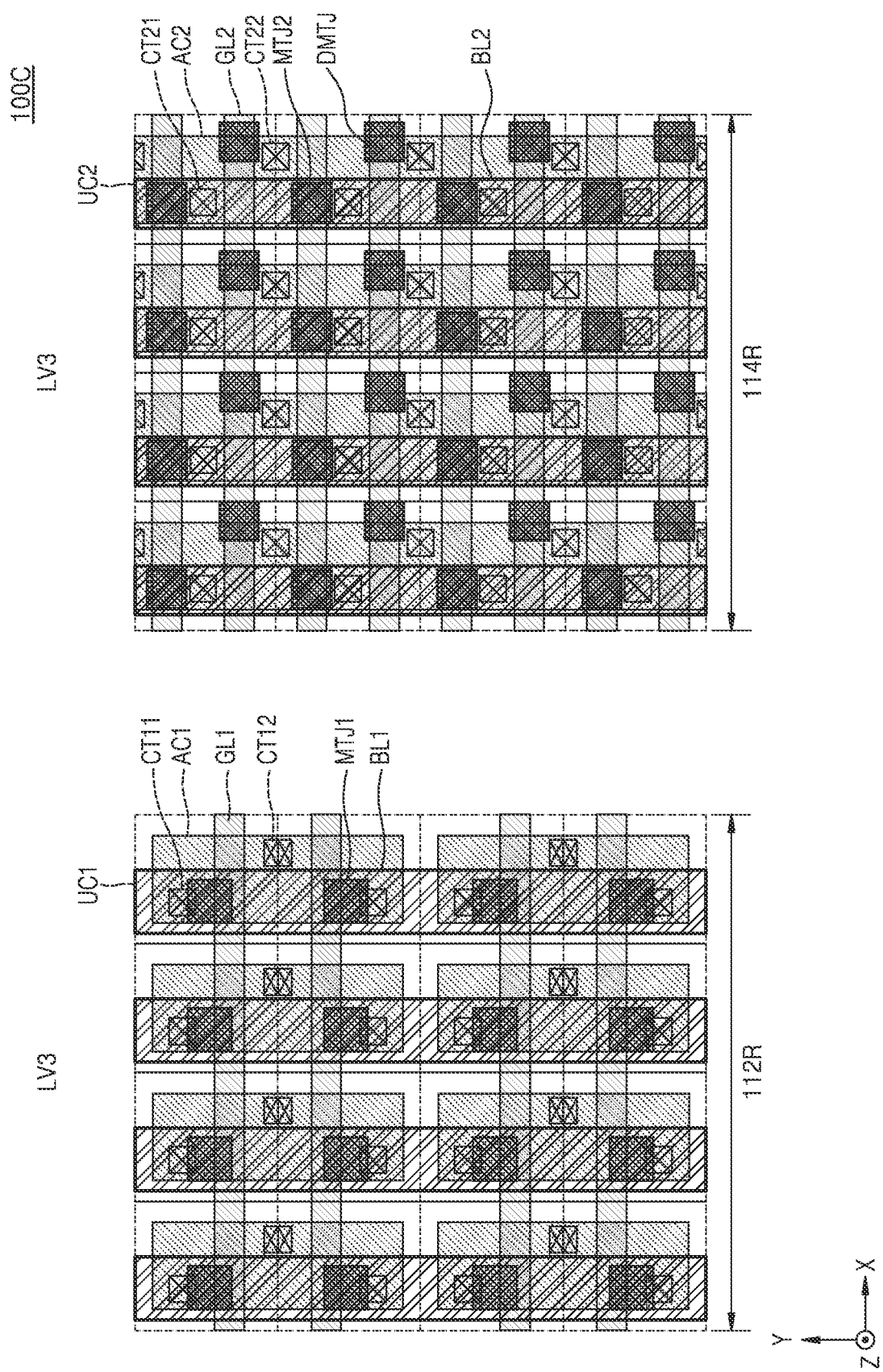

In detail, FIGS. 10A, 11A, and 12A illustrate a layout of a first level LV1 closest to a semiconductor substrate 101, FIGS. 10B, 11B, and 12B illustrate a layout of a second level LV2 disposed on the first level LV1, and FIGS. 10C, 11C, and 12C illustrate a layout of a third level LV3 disposed on the second level LV2.

In other words, the layout of the first level the layout of the second level LV2, and the layout of the third level LV3 may be sequentially arranged in a third direction (a Z direction) perpendicular to a top surface of the semiconductor substrate 101.

Referring to FIGS. 10A to 10C, a magnetic memory device 100A including a normal memory cell area 112R and a OTP memory cell area 114R each disposed in one semiconductor substrate 101 is illustrated.

As illustrated in a left region of FIG. 10A, a normal memory cell area 112R of the first level LV1 may include a plurality of first unit cell areas UC1 arranged in rows and columns. Each of the first unit cell areas UC1 may include a first active region AC1, a first contact CT11 and a second contact CT12 each contacting the first active region AC1, and a first gate line GL1 crossing the first active region AC1 and extending in a first direction (an X direction).

The first active regions AC1 may be isolated from one another by an isolation layer 102 of the semiconductor substrate 101. Each of the first active regions AC1 may be formed in a rectangular shape which has a first width W1 in or along the first direction (the X direction) and has a first length L1 in or along a second direction (a Y direction), but is not limited thereto. The first active region AC1 may be formed over two first unit cell areas UC1 adjacent to each other in the second direction (the Y direction).

In some embodiments, the first contact CT11 may be formed to contact a drain region DR (see FIG. 13A) of the first active region AC1, and the second contact CT12 may be formed to contact a source region SR (see FIG. 13A) of the first active region AC1. In other embodiments, the first contact CT11 may be formed to contact the source region SR (see FIG. 13A) of the first active region AC1, and the second contact CT12 may be formed to contact the drain region DR (see FIG. 13A) of the first active region AC1.

The first gate lines GL1 may cross the first active regions AC1 and may extend in the first direction (the X direction), and moreover, may be spaced apart from one another in the second direction (the Y direction). The first contact CT11 may be formed on or adjacent one sidewall of the first gate line GL1, and the second contact CT12 may be formed on or adjacent the other (e.g., an opposing) sidewall of the first gate line GL1. The first gate line GL1 may be referred to as a first word line.

As illustrated in a right region of FIG. 10A, a OTP memory cell area 114R of the first level LV1 may include a plurality of second unit cell areas UC2 arranged in rows and columns. Each of the second unit cell areas UC2 may include a second active region AC2, a third contact CT21 and a fourth contact CT22 each contacting the second active region AC2, and a second gate line GL2 crossing the second active region AC2 and extending in the first direction (the X direction).

The second active regions AC2 may be isolated from one another by the isolation layer 102 of the semiconductor substrate 101. Each of the second active regions AC2 may be formed in a rectangular shape which has a second width W2 in or along the first direction (the X direction) and has a second length L2 in or along the second direction (the Y direction), but is not limited thereto. The second active region AC2 may be formed over two second unit cell areas UC2 adjacent to each other in the second direction (the Y direction).

Here, the second width W2 of the second active region AC2 may be greater than the first width W1 of the first active region AC1. Also, the second length L2 of the second active region AC2 may be substantially equal to the first length L1 of the first active region AC1.

In some embodiments, the third contact CT21 may be formed to contact a drain region DR (see FIG. 13A) of the second active region AC2, and the fourth contact CT22 may be formed to contact a source region SR (see FIG. 13A) of the second active region AC2. In other embodiments, the third contact CT21 may be formed to contact the source region SR (see FIG. 13A) of the second active region AC2, and the fourth contact CT22 may be formed to contact the drain region DR (see FIG. 13A) of the second active region AC2.

The second gate lines GL2 may cross the second active regions AC2 and may extend in the first direction (the X direction), and moreover, may be spaced apart from one another in the second direction (the Y direction). The third contact CT21 may be formed on or adjacent one sidewall of the second gate line GL2, and the fourth contact CT22 may be formed on or adjacent the other (e.g., an opposing) sidewall of the second gate line GL2. The second gate line GL2 may be referred to as a second word line.

As illustrated in a left region of FIG. 10B, a normal memory cell area 112R of the second level LV2 may include a first source line SL1 which connects a plurality of second contacts CT12 and extends in a second direction (a Y direction).

A plurality of first source lines SL1 may connect the second contacts CT12 and may extend in the second direction (the Y direction), and moreover, may be spaced apart from one another in a first direction (an X direction). A portion of a first gate line GL1 may be disposed to overlap the first source line SL1 at the first level LV1, i.e., in plan view.

As illustrated in a right region of FIG. 10B, a OTP memory cell area 114R of the second level LV2 may include a second source line SL2 which connects a plurality of fourth contacts CT22 and extends in the first direction (the X direction).

A plurality of second source lines SL2 may connect the fourth contacts CT22 and may extend in the first direction (the X direction), and moreover, may be spaced apart from one another in the second direction (the Y direction). A second gate line GL2 may be disposed not to overlap the second source line SL2 at the first level LV1 in plan view.

Here, an extension direction of the second source line SL2 may be perpendicular to an extension direction of the first source line SL1. That is, the OTP memory cell area 114R may be provided in a cell structure which differs from that of the normal memory cell area 112R.

As illustrated in a left region of FIG. 10C, a normal memory cell area 112R of the third level LV3 may include a plurality of first MTJ structures MTJ1 and a first bit line BL1 which connects the first MTJ structures MTJ1 and extends in a second direction (a Y direction).

The first MTJ structures MTJ1 may be formed in any of various MTJ structures 22, 522, 622, 722, 822, 922 described above. A plurality of first bit lines BL1 may connect the first MTJ structures MTJ1 and may extend in the second direction (the Y direction), and moreover, may be spaced apart from one another in a first direction (an X direction). A portion of a first gate line GL1 may be disposed to overlap the first bit line BL1 at the first level LV1 in plan view.

As illustrated in a right region of FIG. 10C, a OTP memory cell area 114R of the third level LV3 may include a plurality of second MTJ structures MTJ2, a plurality of dummy MTJ structures DMTJ, and a second bit line BL2 which connects the second MTJ structures MTJ2 and extends in the second direction (the Y direction). As used herein, dummy structures or elements may refer to non-functional structures or elements.

The second MTJ structures MTJ2 and the dummy MTJ structures DMTJ may be formed in any of various MTJ structures 22, 522, 622, 722, 822, 922 described above. A plurality of second bit lines BL2 may connect the second MTJ structures MTJ2 and may extend in the second direction (the Y direction), and moreover, may be spaced apart from one another in the first direction (the X direction). A portion of a second gate line GL2 may be disposed to overlap the second bit line BL2 at the first level LV1 in plan view. In some embodiments, a width of the second bit line BL2 in or along the first direction (the X direction) may be greater than that of the first bit line BL1 in or along the first direction (the X direction).

Here, the dummy MTJ structures DMTJ may be disposed in parallel with the second MTJ structures MTJ2. The number of dummy MTJ structures DMTJ may be the same as the number of second MTJ structures MTJ2. The dummy MTJ structures DMTJ may not be connected to the second bit line BL2 and/or the second source line SL2, and thus, may not operate as a variable resistance element. This will be described below in detail.

Referring to FIGS. 11A to 11C, a magnetic memory device 100B including a normal memory cell area 112R and a OTP memory cell area 114R each disposed in one semiconductor substrate 101 is illustrated.

Hereinafter, most elements configuring the magnetic memory device 100B may be substantially the same as or similar to the magnetic memory device 100A described above. Therefore, for convenience of description, differences with respect to the magnetic memory device 100A described above will be mainly described below.

As illustrated in a left region of FIG. 11A, a normal memory cell area 112R of the first level LV1 may include a plurality of first unit cell areas UC1 arranged in rows and columns. Each of the first unit cell areas UC1 may include a first active region AC1, a first contact CT11 and a second contact CT12 each contacting the first active region AC1, and a first gate line GL1 crossing the first active region AC1 and extending in a first direction (an X direction).

As illustrated in a right region of FIG. 11A, a OTP memory cell area 114R of the first level LV1 may include a plurality of second unit cell areas UC2 arranged in rows and columns. Each of the second unit cell areas UC2 may include a second active region AC2, a third contact CT21 and a fourth contact CT22 each contacting the second active region AC2, and a second gate line GL2 crossing the second active region AC2 and extending in the first direction (the X direction).

As illustrated in a left region of FIG. 11B, a normal memory cell area 112R of a second level LV2 may include a first source line SL1 which connects a plurality of second contacts CT12 and extends in a second direction (a Y direction).

A plurality of first source lines SL1 may connect the second contacts CT12 and may extend in the second direction (the Y direction), and moreover, may be spaced apart from one another in a first direction (an X direction). A portion of a first gate line GL1 may be disposed to overlap the first source line SL1 at the first level LV1 in plan view.

As illustrated in a right region of FIG. 11B, a OTP memory cell area 114R of the second level LV2 may include a plurality of second source lines SL2 which connect a plurality of fourth contacts CT22 and intersect with one another and extend in the first direction (the X direction) and the second direction (the Y direction).

The plurality of second source lines SL2 may each include a first portion SL2$x$, connecting the fourth contacts CT22 and extending in the first direction (the X direction), and a second portion SL2$y$ extending in the second direction (the Y direction). That is, the second source lines SL2 may be formed in a mesh form.

Here, an extension direction of the first portion SL2$x$ of the second source line SL2 may be perpendicular to an extension direction of the first source line SL1. Also, an extension direction of the second portion SL2$y$ of the second source line SL2 may be parallel to an extension direction of the first source line SL1. That is, the OTP memory cell area 114R may be provided in a cell structure which differs from that of the normal memory cell area 112R.

As illustrated in a left region of FIG. 11C, a normal memory cell area 112R of a third level LV3 may include a plurality of first MTJ structures MTJ1 and a first bit line BL1 which connects the first MTJ structures MTJ1 and extends in a second direction (a Y direction). The first MTJ structures MTJ1 may be formed in any of various MTJ structures 22, 522, 622, 722, 822, 922 described above.

As illustrated in a right region of FIG. 11C, a OTP memory cell area 114R of the third level LV3 may include a plurality of second MTJ structures MTJ2, a plurality of dummy MTJ structures DMTJ, and a second bit line BL2 which connects the second MTJ structures MTJ2 and extends in the second direction (the Y direction). The second MTJ structures MTJ2 and the dummy MTJ structures DMTJ may be formed in any of various MTJ structures 22, 522, 622, 722, 822, 922 described above.

Referring to FIGS. 12A to 12C, a magnetic memory device 100C including a normal memory cell area 112R and a OTP memory cell area 114R each disposed in one semiconductor substrate 101 is illustrated.

Hereinafter, most elements configuring the magnetic memory device 100C may be substantially the same as or similar to the magnetic memory device 100A described above. Therefore, for convenience of description, differences with respect to the magnetic memory device 100A described above will be mainly described below.

As illustrated in a left region of FIG. 12A, a normal memory cell area 112R of a first level LV1 may include a plurality of first unit cell areas UC1 arranged in rows and columns. Each of the first unit cell areas UC1 may include a first active region AC1, a first contact CT11 and a second contact CT12 each contacting the first active region AC1, and a first gate line GL1 crossing the first active region AC1 and extending in a first direction (an X direction).

As illustrated in a right region of FIG. 12A, a OTP memory cell area 114R of the first level LV1 may include a plurality of second unit cell areas UC2 arranged in rows and columns. Each of the second unit cell areas UC2 may include a second active region AC2, a third contact CT21 and a fourth contact CT22 each contacting the second active region AC2, and a second gate line GL2 crossing the second active region AC2 and extending in the first direction (the X direction).

In some embodiments, the number of second gate lines GL2 per second unit cell area UC2 may be greater than the number of first gate lines GL1 per first unit cell area UC1.

The second active regions AC2 may be isolated from one another by the isolation layer 102 of the semiconductor substrate 101. Each of the second active regions AC2 may be formed to extend while having a third width W3 in or along the first direction (the X direction) and having a third length L3 in or along the second direction (the Y direction), but is not limited thereto. The second active region AC2 may extend in the second direction (the Y direction) and may be formed over a plurality of second unit cell areas UC2.

Here, the third width W3 of the second active region AC2 may be substantially equal to the first width W1 of the first active region AC1. Also, the third length L3 of the second active region AC2 may be greater than the first length L1 of the first active region AC1.

As illustrated in a left region of FIG. 12B, a normal memory cell area 112R of the second level LV2 may include a first source line SL1 which connects a plurality of second contacts CT12 and extends in a second direction (a Y direction).

As illustrated in a right region of FIG. 12B, a OTP memory cell area 114R of the second level LV2 may include a second source line SL2 which connects a plurality of fourth contacts CT22 and extends in the first direction (the X direction).

A plurality of second source lines SL2 may connect the fourth contacts CT22 and may extend in the first direction (the X direction), and moreover, may be spaced apart from one another in the second direction (the Y direction). A second gate line GL2 may be disposed not to overlap with the second source line SL2 at the first level LV1 in plan view.

Here, an extension direction of the second source line SL2 may be perpendicular to an extension direction of the first source line SL1. That is, the OTP memory cell area 114R may be provided in a cell structure which differs from that of the normal memory cell area 112R.

As illustrated in a left region of FIG. 12C, a normal memory cell area 112R of a third level LV3 may include a plurality of first MTJ structures MTJ1 and a first bit line BL1 which connects the first MTJ structures MTJ1 and extends in a second direction (a Y direction). The first MTJ structures MTJ1 may be formed in any of various MTJ structures 22, 522, 622, 722, 822, 922 described above.

As illustrated in a right region of FIG. 12C, a OTP memory cell area 114R of the third level LV3 may include a plurality of second MTJ structures MTJ2, a plurality of dummy MTJ structures DMTJ, and a second bit line BL2 which connects the second MTJ structures MTJ2 and extends in the second direction (the Y direction). In some embodiments, a width of the second bit line BL2 in the first direction (the X direction) may be substantially equal to that of the first bit line BL1 in the first direction (the X direction). The second MTJ structures MTJ2 and the dummy MTJ structures DMTJ may be formed in any of various MTJ structures 22, 522, 622, 722, 822, 922 described above.

Here, the dummy MTJ structures DMTJ may be disposed in a zigzag pattern with respect to the second MTJ structures MTJ2 or may otherwise not overlap with the second bit line BL2 in plan view. The number of dummy MTJ structures DMTJ may be the same as the number of second MTJ structures MTJ2. The dummy MTJ structures DMTJ may not be connected to the second bit line BL2 and/or the second source line SL2, and thus, may not operate as a variable resistance element. This will be described below in detail.

Figure 13A:
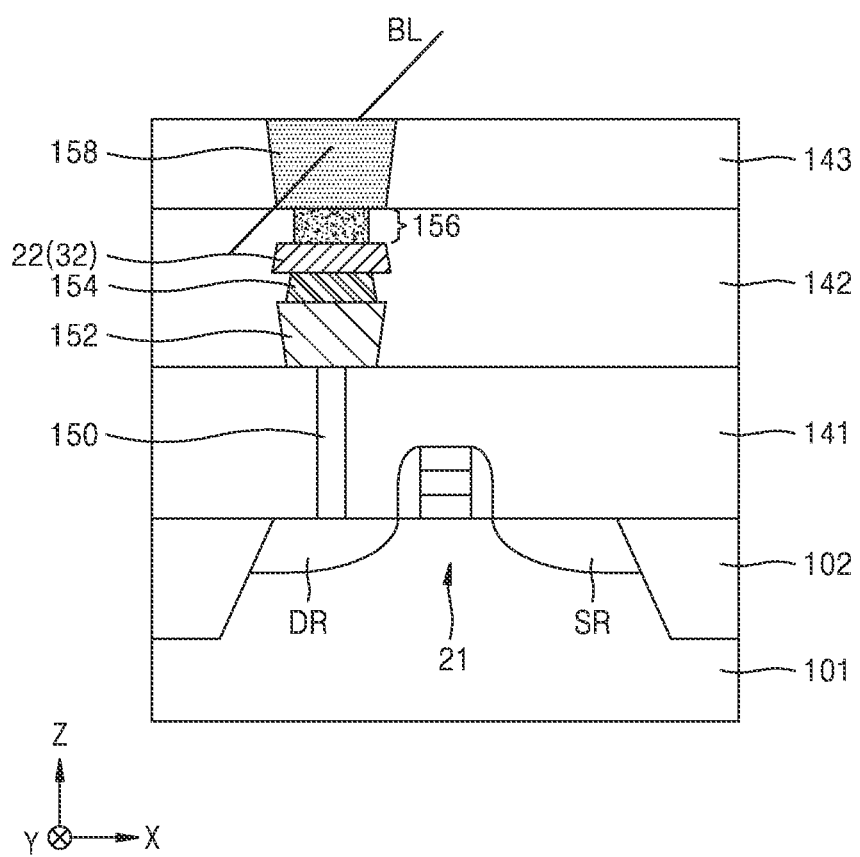
FIGS. 13A, 13B, and 13C are cross-sectional views illustrating cell structures of a magnetic memory device according to some embodiments.
Figure 13B:
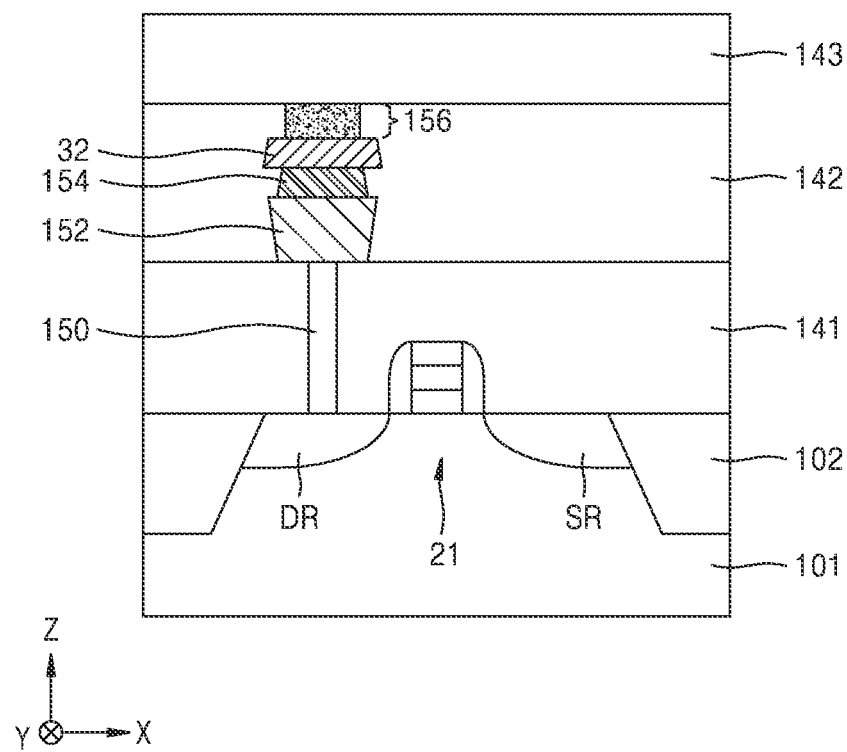
Figure 13C:
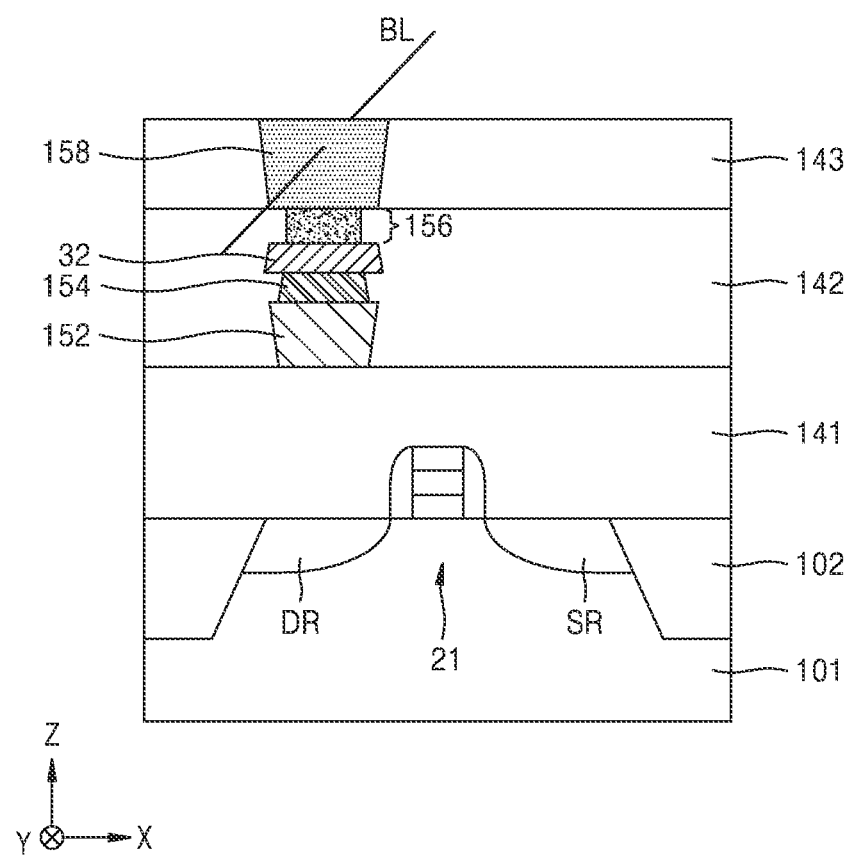

FIGS. 13A to 13C are cross-sectional views illustrating a cell structure of a magnetic memory device according to some embodiments.

Referring to FIG. 13A, a first MTJ structure MTJ included in a normal memory cell area 112R (see FIG. 10C) may be connected to a drain region DR of a selection transistor 21, formed thereunder, through a contact 150 and may be connected to a bit line BL, formed thereon, through an upper electrode 156.

A semiconductor substrate 101 may include a semiconductor material, for example, Group IV semiconductor, Group III-V compound semiconductor, or Group II-VI oxide semiconductor. For example, the Group IV semiconductor may include silicon (Si), germanium (Ge), or silicon-germanium. The semiconductor substrate 101 may be provided as a bulk wafer or a wafer with an epitaxial layer formed therein. In other embodiments, the semiconductor substrate 101 may include a silicon on insulator (SOI) substrate or a germanium on insulator (GeOI) substrate.

An isolation layer 102 and an active region limited by the isolation layer 102 may be defined in the semiconductor substrate 101. The isolation layer 102 may include silicon oxide, silicon nitride, or a combination thereof. For example, a selection transistor 21 may be disposed in the active region of the semiconductor substrate 101.

A source region SR and a drain region DR may be formed at opposing sides of the selection transistor 21. The drain region DR of the selection transistor 21 may be electrically connected to a pad electrode 152 through a contact 150 passing through a first insulation layer 141. A lower electrode 154 may be formed on the pad electrode 152, and a first MTJ structure MTJ1 may be formed on the lower electrode 154. The upper electrode 156 may be formed on the first MTJ structure MTJ1, and a bit line BL may be electrically connected to the first MTJ structure MTJ1 through the upper electrode 156. In some embodiments, the pad electrode 152, the lower electrode 154, the first MTJ structure MTJ1, and the upper electrode 156 may be disposed in a second insulation layer 142. Also, the bit line BL may be disposed in a third insulation layer 143.

Likewise, a second MTJ structure MTJ2 included in a OTP memory cell area 114R (see FIG. 10C) may have substantially the same shape as that of the first MTJ structure MTJ1. Therefore, an active element including the first MTJ structure MTJ1 and the second MTJ structure MTJ2 may operate as a memory device.

Referring to FIG. 13B, a dummy MTJ structure DMTJ which is a dummy element and is included in a OTP memory cell area 114R (see FIG. 10C) may be connected to a drain region DR of a selection transistor 21, formed thereunder, through a contact 150 and may not be connected to a bit line (not shown) formed thereon.

The drain region DR of the selection transistor 21 may be electrically connected to a pad electrode 152 through a contact 150 passing through a first insulation layer 141. A lower electrode 154 may be formed on the pad electrode 152, and a dummy MTJ structure DMTJ may be formed on the lower electrode 154. An upper electrode 156 may be formed on the dummy MTJ structure DMTJ. In some embodiments, the pad electrode 152, the lower electrode 154, the dummy MTJ structure DMTJ, and the upper electrode 156 may be disposed in a second insulation layer 142.

Here, a top surface of the upper electrode 156 may be covered by a third insulation layer 143. That is, the bit line may not be connected to the dummy MTJ structure DMTJ. Therefore, a dummy element including the dummy MTJ structure DMTJ may not operate as a memory device.

Referring to FIG. 13C, a dummy MTJ structure DMTJ which is a dummy element and is included in a OTP memory cell area 114R (see FIG. 10C) may not be connected to a drain region DR of a selection transistor 21 formed thereunder and may be connected to a bit line BL, formed thereon, through an upper electrode 156.

A lower electrode 154 may be formed on a pad electrode 152, and the dummy MTJ structure DMTJ may be formed on the lower electrode 154. The upper electrode 156 may be formed on the dummy MTJ structure DMTJ, and the bit line BL may be electrically connected to the dummy MTJ structure DMTJ through the upper electrode 156. In some embodiments, the pad electrode 152, the lower electrode 154, the dummy MTJ structure DMTJ, and the upper electrode 156 may be disposed in a second insulation layer 142. Also, the bit line BL may be disposed in a third insulation layer 143.

Here, a top surface of the drain region DR of the selection transistor 21 may be formed to be covered by a first insulation layer 141. That is, a contact may not be connected to the dummy MTJ structure DMTJ. In other words, a source line may not be connected to the dummy MTJ structure DMTJ. Therefore, a dummy element including the dummy MTJ structure DMTJ may not operate as a memory device.

Figure 14:
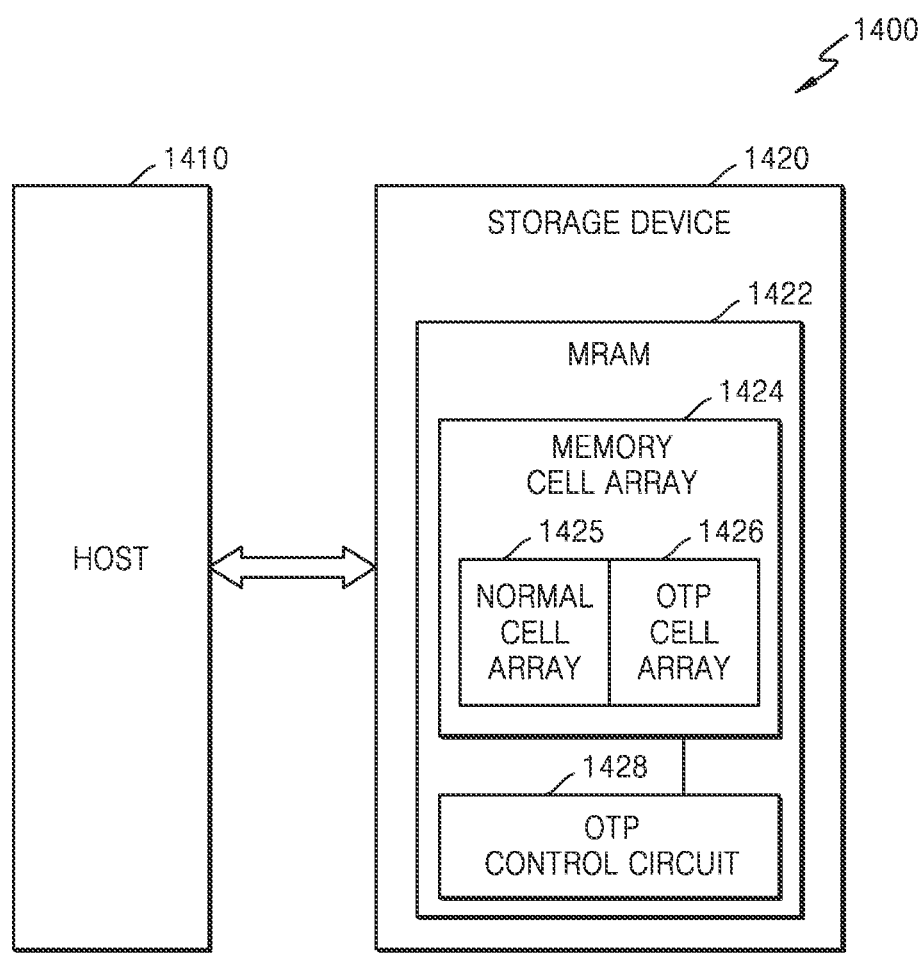
FIG. 14 is a block diagram illustrating an electronic device including a magnetic memory device, according to an embodiment.

FIG. 14 is a block diagram illustrating an electronic device 1400 including a magnetic memory device according to an embodiment.

Referring to FIG. 14, the electronic device 1400 may include a host 1410 and a storage device 1420.

The host 1410 may include, for example, a user device such as a personal computer, a portable computer, a tablet personal computer (PC), a smartphone, a digital camera, or a camcorder. The host 1410 may store or read data in or from the storage device 1420 through an input/output (I/O) request.

The host 1410 may be connected to the storage device 1420 through various interfaces such as universal serial bus (USB), multimedia card (MMC), peripheral component interconnection (PCI), PCI express (PIC-E), advanced technology attachment (ATA), serial-ATA (SATA), parallel-ATA (PATA), small computer system interface (SCSI), enhanced small disk interface (ESDI), and integrated drive electronics (IDE).

The storage device 1420 may be a data storage unit for performing a write operation or a read operation on the basis of the I/O request of the host 1410 and may include a magnetic memory device 1422. The magnetic memory device 1422 may include a memory cell array 1424 and a OTP control circuit 1428, and the memory cell array 1424 may include a normal memory cell array 1425 and a OTP memory cell array 1426.

A plurality of normal memory cells each including a first selection transistor and a first variable resistance element may be arranged in the normal memory cell array 1425, and each of bit lines of the normal memory cells may be provided to a sense amplifier. A plurality of OTP memory cells each including a second selection transistor and a short-circuited second variable resistance element may be arranged in the OTP memory cell array 1426, and each of OTP bit lines of the OTP memory cells may be provided to the sense amplifier.

The OTP control circuit 1428 may generate a reference resistor or reference resistance, instead of the short-circuited second variable resistance element of the OTP memory cell, and may provide the reference resistor to the OTP bit line. The sense amplifier may sense and amplify a current which flows in the bit line of the normal memory cell and the OTP bit line of the OTP memory cell connected to the reference resistor, thereby enhancing a sensing margin of the normal memory cell.

Figure 15:
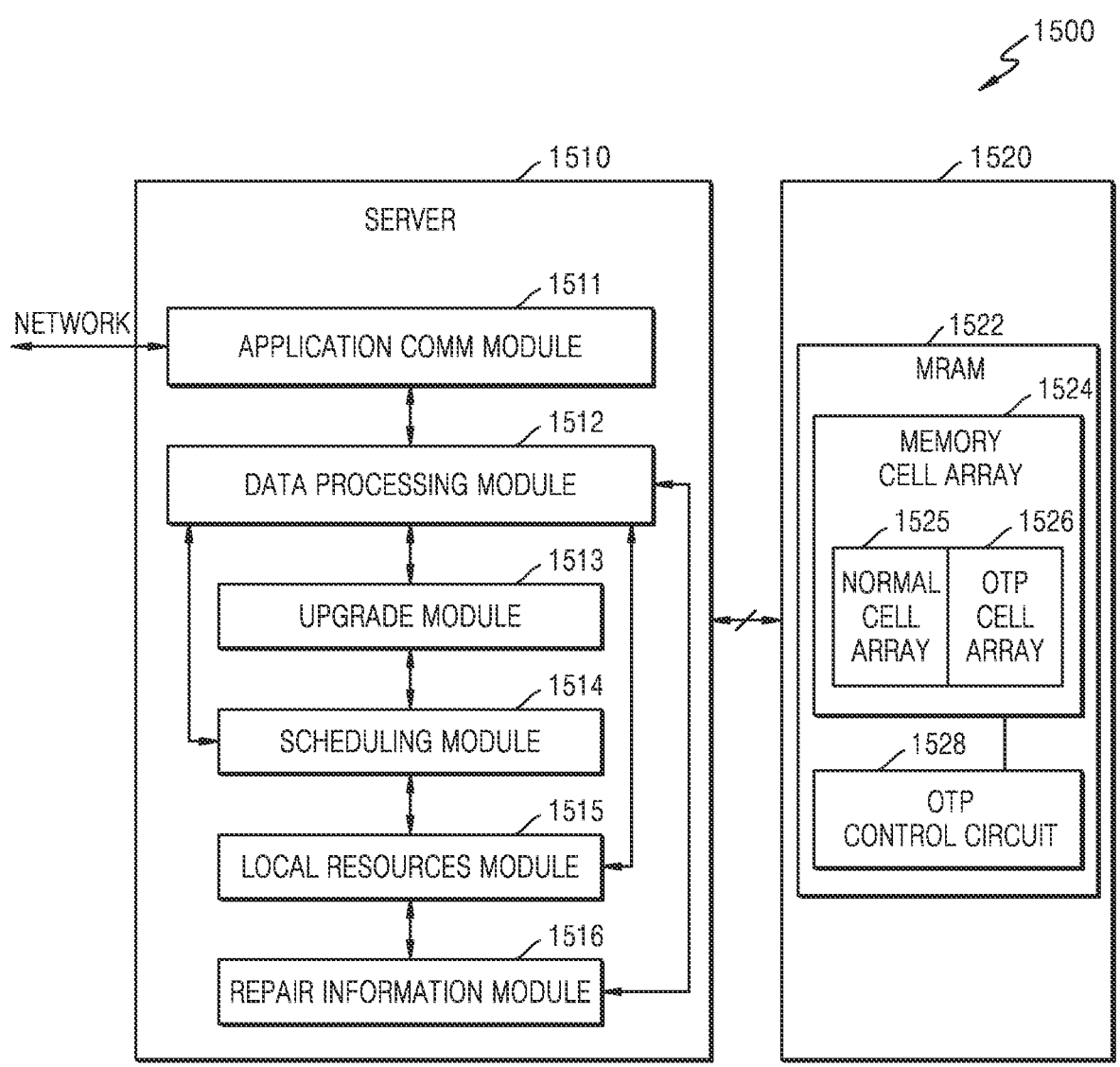
FIG. 15 is a block diagram illustrating a server system including a magnetic memory device, according to an embodiment.

FIG. 15 is a block diagram illustrating a server system 1500 including a magnetic memory device according to an embodiment.

Referring to FIG. 15, the server system 1500 may include a server 1510 and at least one storage device 1520 which stores data needed for operating the server 1510.

The server 1510 may include an application communication module 1511, a data processing module 1512, an upgrade module 1513, a schedule module 1514, a local resource module 1515, and a repair information module 1516. The application communication module 1511 may be implemented to communicate with a computing system connected to the server 1510 and a network or to enable the server 1510 to communicate with the storage device 1520. The application communication module 1511 may transmit data or information, provided through a user interface, to the data processing module 1512.

The data processing module 1512 may be linked to the local resource module 1515. The local resource module 1515 may provide a list of repair shops/dealers/technical information on the basis of data or information connected to the server 1510. The upgrade module 1513 may interface with the data processing module 1512. The upgrade module 1513 may upgrade firmware, a reset code, diagnosis upgrade information, or other pieces of information to an electronic product on the basis of data or information transmitted from the storage device 1520.

The schedule module 1514 may allow a real-time option to a user on the basis of data or information input to the server 1510. The repair information module 1516 may interface with the data processing module 1512. The repair information module 1516 may be used to provide a user with repair-related information (for example, an audio, a video, or a document file). The data processing module 1512 may package relevant information on the basis of information transmitted from the storage device 1520. Such information may be transmitted to the storage device 1520, or may be displayed to a user. The storage device 1520 may be a data storage unit and may include the magnetic memory device 1522.

The magnetic memory device 1522 may include a memory cell array 1524 and a OTP control circuit 1528, and the memory cell array 1524 may include a normal memory cell array 1525 and a OTP memory cell array 1526.

A plurality of normal memory cells each including a first selection transistor and a first variable resistance element may be arranged in the normal memory cell array 1525, and each of bit lines of the normal memory cells may be provided to a sense amplifier. A plurality of OTP memory cells each including a second selection transistor and a short-circuited second variable resistance element (or second variable resistance element that is configured to be short-circuited) may be arranged in the OTP memory cell array 1526, and each of OTP bit lines of the OTP memory cells may be provided to the sense amplifier.

The OTP control circuit 1528 may generate a reference resistor or resistance, instead of the short-circuited second variable resistance element of the OTP memory cell, and may provide the reference resistor to the OTP bit line. The sense amplifier may sense and amplify a current which flows in the bit line of the normal memory cell and the OTP bit line of the OTP memory cell connected to the reference resistor, thereby enhancing a sensing margin of the normal memory cell.

While the inventive concept has been particularly shown and described with reference to embodiments thereof, it will be understood that various changes in form and details may be made therein without departing from the scope of the following claims.

What is claimed is:

1. A magnetic memory device comprising:
    a plurality of first bit lines and a plurality of second bit lines;
    a plurality of first source lines respectively corresponding to the plurality of first bit lines and a plurality of second source lines respectively corresponding to the plurality of second bit lines;
    a plurality of first memory cells connected between the plurality of first bit lines and the plurality of first source lines, respectively, in a first cell structure in a first region, the plurality of first memory cells each comprising a first memory device and a first selection transistor; and
    a plurality of second memory cells connected between the plurality of second bit lines and the plurality of second source lines, respectively, in a second cell structure in a second region, the plurality of second memory cells each comprising a second memory device and a second selection transistor,
    wherein each of the first memory device and the second memory device comprises a magnetic tunnel junction comprising a pinned layer, a tunnel barrier layer, and a free layer,
    wherein the magnetic tunnel junction in one or more of the second memory devices is configured to provide an irreversible resistance state in which the tunnel barrier layer is insulation-broken, and
    wherein the first and second cell structures differ, and the plurality of first source lines extend perpendicular to the plurality of second source lines.

2. The magnetic memory device of claim 1, further comprising:
    a plurality of first word lines extending in a first direction in the first region and a plurality of second word lines extending in the first direction in the second region,
    wherein the plurality of first source lines extend in a second direction perpendicular to the first direction,
    wherein the plurality of second source lines extend in the first direction, and
    wherein a width of a first active region in the first region along the first direction is less than a width of a second active region in the second region along the first direction.

3. The magnetic memory device of claim 2, wherein the plurality of first bit lines and the plurality of second bit lines extend in the second direction, and
    wherein a width of each of the plurality of first bit lines along the first direction is less than a width of each of the plurality of second bit lines along the first direction.

4. The magnetic memory device of claim 1, wherein the plurality of first memory cells comprise unit memory cells that define a normal memory cell array and are configured to be programmed a plurality of times, and
    wherein the plurality of second memory cells comprise unit memory cells that define a one time programmable (OTP) memory cell array and are configured to be programmed once.

5. The magnetic memory device of claim 4, wherein a unit memory cell among the unit memory cells of the normal memory cell array has a 1T-1R structure, and a unit memory cell among the unit memory cells of the OTP memory cell array has a 2T-1R structure.

6. The magnetic memory device of claim 1, wherein some of the second memory devices are active elements, and others of the second memory devices are dummy elements.

7. The magnetic memory device of claim 6, wherein a number of the active elements is equal to a number of the dummy elements.

8. The magnetic memory device of claim 6, wherein the dummy elements are not connected to the plurality of second bit lines.

9. The magnetic memory device of claim 6, wherein the dummy elements are not connected to the plurality of second source lines.

10. The magnetic memory device of claim 1, further comprising:
    a peripheral circuit electrically connected to the plurality of first memory cells and the plurality of second memory cells.

11. A magnetic memory device comprising:
    a plurality of first active regions spaced apart from one another in a first direction and a second direction in a first region, the first and second directions being perpendicular to each other;
    a plurality of second active regions spaced apart from one another in the first direction and extending in the second direction in a second region;
    a plurality of first bit lines in the first region and a plurality of second bit lines in the second region;
    a plurality of first source lines respectively corresponding to the plurality of first bit lines and a plurality of second source lines respectively corresponding to the plurality of second bit lines;
    a plurality of first memory cells connected between the plurality of first bit lines and the plurality of first source lines, respectively, in the first region, the plurality of first memory cells each comprising a first memory device and a first selection transistor; and
    a plurality of second memory cells connected between the plurality of second bit lines and the plurality of second source lines, respectively, in the second region, the plurality of second memory cells each comprising a second memory device and a second selection transistor,
    wherein respective cell structures of the first region and the second region differ, the plurality of first source lines extend in the second direction, and the plurality of second source lines extend in the first direction, and
    wherein one or more of the second memory devices are configured to be programmed to an irreversible resistance state.

12. The magnetic memory device of claim 11, wherein each of the first memory device and the second memory device comprises a magnetic tunnel junction comprising a pinned layer, a tunnel barrier layer, and a free layer, and wherein the magnetic tunnel junction of each of the second memory device is configured to provide the irreversible resistance state responsive to the tunnel barrier layer being insulation-broken.

13. The magnetic memory device of claim 12, wherein the plurality of first memory cells define a normal memory cell array and are configured to be programmed a plurality of times, and wherein the plurality of second memory cells define a one time programmable (OTP) memory cell array and are configured to be programmed once.

14. The magnetic memory device of claim 11, wherein some of the second memory devices are active elements, others of the second memory devices are dummy elements, and the active elements and the dummy elements are arranged in a zigzag pattern along the second direction.

15. The magnetic memory device of claim 11, wherein the plurality of first bit lines and the plurality of second bit lines extend in the second direction, and wherein a width of each of the plurality of first bit lines along the first direction is substantially equal to a width of each of the plurality of second bit lines along the first direction.

16. The magnetic memory device of claim 11, wherein the first and second memory cells respectively comprise unit memory cells, further comprising:

a plurality of first word lines arranged in the first region and a plurality of second word lines arranged in the second region, wherein a number of the first word lines per unit memory cell among the unit memory cells of the first memory cells is less than a number of the second word lines per unit memory cell among the unit memory cells of the second memory cells.

17. A magnetic memory device comprising:

a memory cell array comprising a normal cell array and a one time programmable (OTP) cell array; and a peripheral circuit electrically connected to the normal cell array and the OTP cell array, wherein the normal cell array comprises a plurality of first word lines and a plurality of first memory cells each comprising a first magnetic tunnel junction (MTJ) and a first selection transistor, wherein the OTP cell array comprises a plurality of second word lines and a plurality of second memory cells each comprising a second MTJ and a second selection transistor, wherein one or more of the second MTJs are configured to be programmed to an irreversible resistance state, and wherein a first active region occupied by the plurality of first memory cells is smaller than a second active region occupied by the plurality of second memory cells along a direction of extension of the first and second word lines.

18. The magnetic memory device of claim 17, wherein, in plan view, the first active region has a short axis in a first direction and a long axis in a second direction perpendicular to the first direction, wherein a width of the short axis of the first active region is less than a width of the second active region along the first direction, and wherein a length of the long axis of the first active region is substantially equal to a length of the second active region along the second direction.

19. The magnetic memory device of claim 17, wherein, in plan view, the first active region has a short axis in a first direction and a long axis in a second direction perpendicular to the first direction, wherein a width of the short axis of the first active region is substantially equal to a width of the second active region along the first direction, and wherein a length of the long axis of the first active region is less than a length of the second active region along the second direction.

20. The magnetic memory device of claim 17, wherein some of memory devices included in the plurality of second memory cells are active elements, and others of the memory devices included in the plurality of second memory cells are dummy elements.

* * * * *